United States Patent [19]
Asada

[11] Patent Number: 5,942,915
[45] Date of Patent: Aug. 24, 1999

[54] LEVEL SHIFT CIRCUIT FORMED BY TWO CASCADED CMOS INVERTERS

[75] Inventor: Hideki Asada, Tokyo, Japan

[73] Assignee: NEC Corporation, Tokyo, Japan

[21] Appl. No.: 08/925,726

[22] Filed: Sep. 9, 1997

[30] Foreign Application Priority Data

Sep. 9, 1996 [JP] Japan ................................ 8-237587

[51] Int. Cl.⁶ ............................................. H03K 19/0175
[52] U.S. Cl. ................................. 326/81; 326/68; 326/83
[58] Field of Search ................................. 326/81, 80, 68, 326/83, 86, 112, 119, 121, 102, 103

[56] References Cited

U.S. PATENT DOCUMENTS

| | | | |
|---|---|---|---|
| 4,028,556 | 6/1977 | Cachier et al. | 326/102 |
| 4,092,548 | 5/1978 | Beilstein, Jr. et al. | 326/102 |
| 4,191,898 | 3/1980 | Ulmer | 326/68 |
| 5,089,862 | 2/1992 | Warner, Jr.et al. | 257/208 |
| 5,323,071 | 6/1994 | Hirayama | 326/68 |
| 5,332,934 | 7/1994 | Hashimoto et al. | 326/121 |
| 5,463,330 | 10/1995 | Tsuchida | 326/81 |
| 5,666,070 | 9/1997 | Merritt et al. | 326/81 |
| 5,705,940 | 1/1998 | Newman et al. | 326/68 |
| 5,821,559 | 10/1998 | Yamazaki et al. | 257/66 |

FOREIGN PATENT DOCUMENTS

| | | |
|---|---|---|
| 50-151433 | 12/1975 | Japan . |
| 57-075027 | 5/1982 | Japan . |
| 62-195921 | 8/1987 | Japan . |
| 2-122724 | 5/1990 | Japan . |

*Primary Examiner*—Michael Tokar
*Assistant Examiner*—Daniel D. Chang
*Attorney, Agent, or Firm*—Sughrue, Mion, Zinn, Macpeak & Seas, PLLC

[57] ABSTRACT

In a level shift circuit including cascaded first and second CMOS inverters, the first CMOS inverter is powered by a first power supply voltage and a second power supply voltage lower than the first power supply voltage. Also, the second CMOS inverter is powered by the first power supply voltage and a third power supply voltage lower than the first power supply voltage. An input voltage supplied to the first CMOS inverter has a high level lower than the first power supply voltage and a low level higher than the second power supply voltage.

14 Claims, 24 Drawing Sheets

FIG. 4

| | | |
|---|---|---|
| PROGRAM | | 5-1 |
| DATA STRUCTURE OF MOVING OBJECT IMAGE WITH ROUTE | | 5-2 |
| THRESHOLD A | | 5-3 |
| THRESHOLD B | | 5-4 |
| FRAME IMAGE DATA | RED IMAGE DATA [160] [120] | 5-5-1 |
| | GREEN IMAGE DATA [160] [120] | 5-5-2 |
| | BLUE IMAGE DATA [160] [120] | 5-5-3 |
| HORIZONTAL EDGE DATA [160] [120] | | 5-6 |
| VERTICAL EDGE DATA [160] [120] | | 5-7 |
| HORIZONTAL EDGE DATA OF PRECEDING FRAME [160] [120] | | 5-8 |
| VERTICAL EDGE DATA OF PRECEDING FRAME [160] [120] | | 5-9 |
| TIME VARIANT HORIZONTAL EDGE DATA [160] [120] | | 5-10 |
| TIME VARIANT VERTICAL EDGE DATA [160] [120] | | 5-11 |
| TIME VARIANT EDGE DATA [16] [12] | | 5-12 |
| TIME VARIANT EDGE DATA OF PRECEDING FRAME [16] [12] | | 5-13 |
| MOVEMENT CHARACTERISTICS REGION DATA [16] [12] | | 5-14 |
| HISTOGRAM DATA [16] [12] [64] | | 5-15 |
| REGION-REPRESENTATIVE COLOR DATA [16] [12] | | 5-16 |
| REGION-REPRESENTATIVE COLOR DATA OF PRECEDING FRAME [16] [12] | | 5-17 |
| REGION-REPRESENTATIVE COLOR DATA OF FURTHER PRECEDING FRAME [16] [12] | | 5-18 |
| IMAGE CHANGE REGIONS DATA [16] [12] | | 5-19 |
| IMAGE CHANGE REGIONS DATA OF PRECEDING FRAME [16] [12] | | 5-20 |
| ROUTE REGION DATA [16] [12] | | 5-21 |
| ROUTE IMAGE DATA | ROUTE RED IMAGE DATA [160] [120] | 5-22-1 |
| | ROUTE GREEN IMAGE DATA [160] [120] | 5-22-2 |
| | ROUTE BLUE IMAGE DATA [160] [120] | 5-22-3 |
| | ROUTE TRANSPARENCY DEGREE DATA [160] [120] | 5-22-4 |
| MOVING OBJECT IMAGE DATA | RED IMAGE DATA [160] [120] | 5-23-1 |
| | GREEN IMAGE DATA [160] [120] | 5-23-2 |
| | BLUE IMAGE DATA [160] [120] | 5-23-3 |

LEVEL SHIFT CIRCUIT FORMED BY TWO CASCADED CMOS INVERTERS

BACKGROUND OF THE INVENTION

1. Field of the Invention

The present invention relates to a level shift circuit which can be used in peripheral driving circuits of a liquid crystal display (LCD) apparatus.

2. Description of the Related Art

In an LCD apparatus, peripheral driving circuits such as a gate bus line driving circuit (scan bus line driving circuit and a drain bus line driving circuit (data bus line driving circuit) are manufactured on the same substrate of an LCD panel of an active matrix type, so that the LCD apparatus can be small in size and is low in cost.

The above-mentioned driving circuits are conventionally formed by using polycrystalline silicon thin film transistors (TFTs), and therefore, the driving power of the driving circuits is low. On the other hand, an external clock signal supplied to the driving circuits conventionally has a low level such as 3.3 V or 5 V. The driving circuits cannot be operated directly by such a low clock signal. In other words, a voltage pull-up circuit on a level shift circuit is required as an interface between an external signal receiving circuit (terminal) for receiving such an external clock signal and the driving circuits.

A prior art level shift circuit is formed by a CMOS inverter for receiving an input voltage and generating two-phase output signals and a CMOS level shifter operated by the two-phase output signals.

In this case, the CMOS inverter is powered by a plower supply voltage which is, for example, 3.3 V, and a lower supply voltage which is 0 V. Also, the CMOS level shifter is powered by a power supply voltage which is, for example, 12 V, and the power supply voltage 0 V.

Further, in order to increase the operation speed, the size of N-channel MOS transistors of the CMOS level shifter is made much larger than that of P-channel MOS transistors thereof (see FIG. 1 of JP-50-151433). This will be explained later in detail.

In the prior art level shift circuit, however, if the transistors are formed by polycrystalline silicon TETs, the absolute value of the threshold voltage of the P-channel MOS transistors and the threshold voltage of the N-channel MOS transistors cannot be about 2 V or less than 2 V, due to the grain boundaries of polycrystalline silicon and a low-temperature chemical vapor deposition (CVD) process. As a result, the level shift circuit cannot normally operate.

SUMMARY OF THE INVENTION

It is an object of the present invention to provide a level shift circuit which can normally operate even when the absolute values of MOs transistors therein are large.

Another object of the present invention is to increase the operation speed of a level shift circuit formed by CMOS circuits.

According to the present invention, in a level shift circuit including cascaded first and second CMOS inverters, the first CMOS inverter is powered by a first power supply voltage and a second power supply voltage lower than the first power supply voltage. Also, the second CMOS inverter is powered by the first power supply voltage and a third power supply voltage lower than the first power supply voltage. An input voltage supplied to the first CMOS inverter has a high level lower than the first power supply voltage and a low level higher than the second power supply voltage.

Also, a transistor gain factor of an N-channel MOS transistor of the first CMOS inverter is made larger than a transistor gain factor of a P-channel MOS transistor of the first CMOS inverter.

BRIEF DESCRIPTION OF THE DRAWINGS

The present invention will be more clearly unders-tood from the description as set forth below, in comparison with the prior art, with reference to the accompanying drawings, wherein.

DESCRIPTION OF THE PREFERRED EMBODIMENTS

Before the description of the preferred embodiment, a prior art level shift circuit will be explained with reference to FIGS. 1 and 2.

Figure 1:
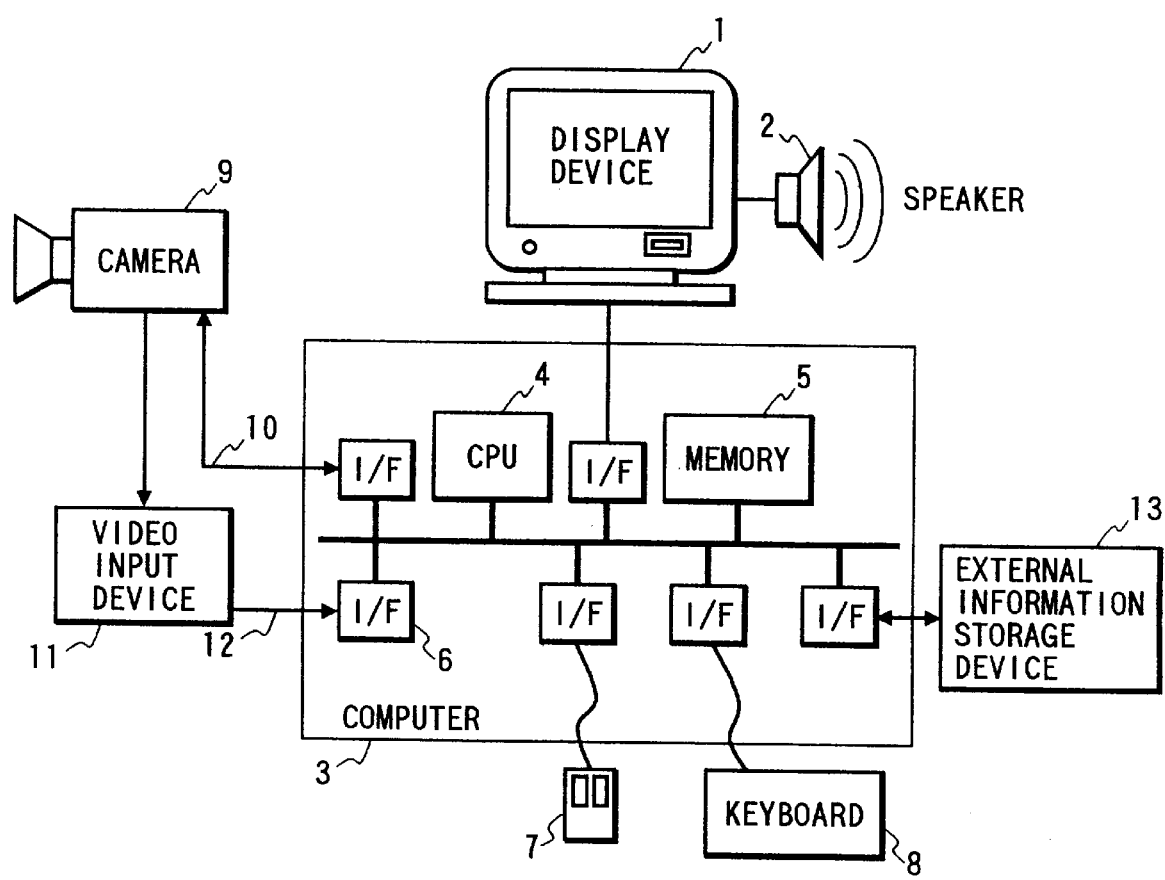
FIG. 1 is a block circuit diagram illustrating a prior art level shift circuit.

In FIG. 1, which illustrates a prior art level shift circuit (see FIG. 1 of JP-50-151433), reference numeral 11 designates a CMOS inverter formed by a P-channel MOS transistor $Q_{n11}$, and an N-channel MOS transistor $Q_{n11}$, and reference numeral 12 designates a CMOS level shifter formed by cross-coupled P-channel MOS transistors $Q_{p12}$ and $Q_{p13}$ and N-channel MOS transistors $Q_{n12}$ and $Q_{n13}$. In this case, the inverter 11 is powered by a power supply voltage $V_{DD1}$ which is, for example, 3.3 V, and a power supply voltage $V_{SS}$ which is 0 V. Also, the level shifter 12 is powered by a power supply voltage $V_{DD2}$ which is, for example, 12 V, and the power supply voltage $V_{SS}$. Further, in order to increase the operation speed, the size of the N-channel MOS transistors $Q_{n12}$ and $Q_{n13}$ is made much larger than that of the P-channel MOS transistors $Q_{p12}$ and $Q_{p13}$. For example, the ratio (W/L) of a channel width to a channel length of the transistors $Q_{p12}$ and $Q_{p13}$ is $(W/L)_p$=24 μm/6 μm On the other hand, the ratio $(W/L)_n$ of a channel width to a channel length of the transistors $Q_{n12}$ and $Q_{n13}$ is $(W/L)_n$=240 μm/6 μm The operation of the circuit of FIG. 1 is explained next. In this case, assume that the absolute value of the threshold voltage $V_{thp}$ of the P-channel MOS transistors and the threshold voltage $V_{thn}$ of the N-channel MOS transistors is about 1 V.

When an input voltage $V_{IN}$ is 0 V, the transistors $Q_{n12}$ and $Q_{p13}$ are turned OFF and the transistors $Q_{p12}$ and $Q_{n13}$ are turned ON, so that an output voltage $V_{OUT}$ becomes 0 V. On the other hand, when the input voltage $V_{IN}$ is $V_{DD1}$, the transistors $Q_{n12}$ and $Q_{p13}$ are turned ON and the transistors $Q_{p12}$ and $Q_{n\ 13}$ are turned OFF, so that the output voltage $V_{OUT}$ becomes $V_{DD2}$ (=12 V).

Thus, the input voltage $V_{IN}$ having a voltage swing of $V_{DD1}$ is changed to the output voltage $V_{OUT}$ having a voltage swing of $V_{DD2}$.

In the level shift circuit of FIG. 1, however, if the transistors are formed by polycrystalline silicon TFTs, since the absolute value of the threshold voltage $V_{thp}$ of the P-channel MOS transistors and the threshold voltage $V_{thn}$ of the N-channel MOS transistors cannot be about 2 V or less than 2 V, the level shift circuit of FIG. 1 cannot normally operate.

Figure 2:
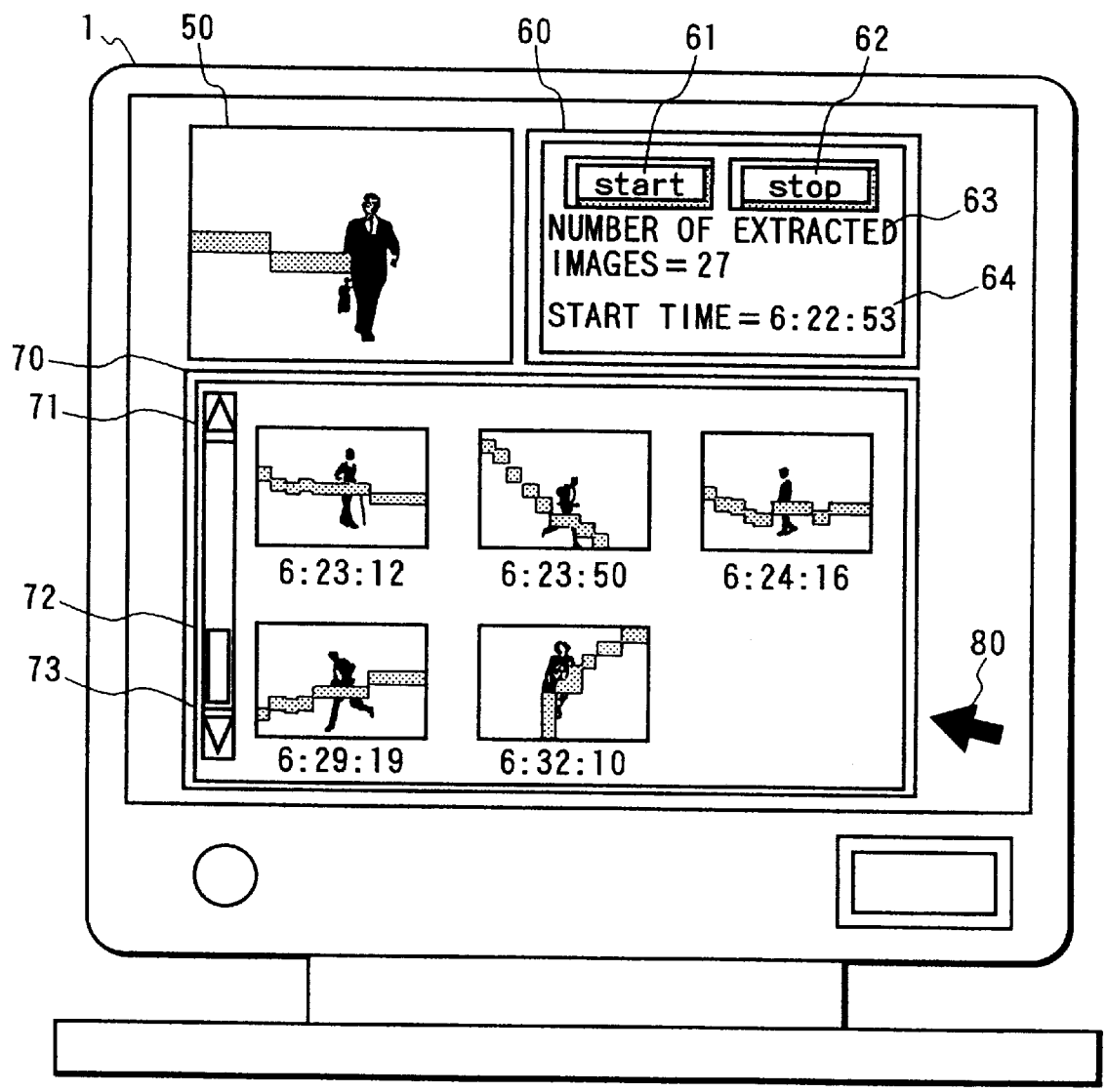
FIG. 2 is a timing diagram showing the operation of the circuit of FIG. 1.

For example, as shown in FIG. 2, when $|V_{thp}|=V_{thn}$=5 V, the output voltage $V_{OUT}$ never becomes high $V_{DD2}$. That is, even when the input voltage $V_{IN}$ is $V_{DD1}$(=3.3 V), the transistor $Q_{n2}$ is never turned ON, so that the voltage $V_1$ at a node between the transistors $Q_{p2}$ and $Q_{n2}$ always remains at $V_{DD2}$(=12 V).

Figure 3:
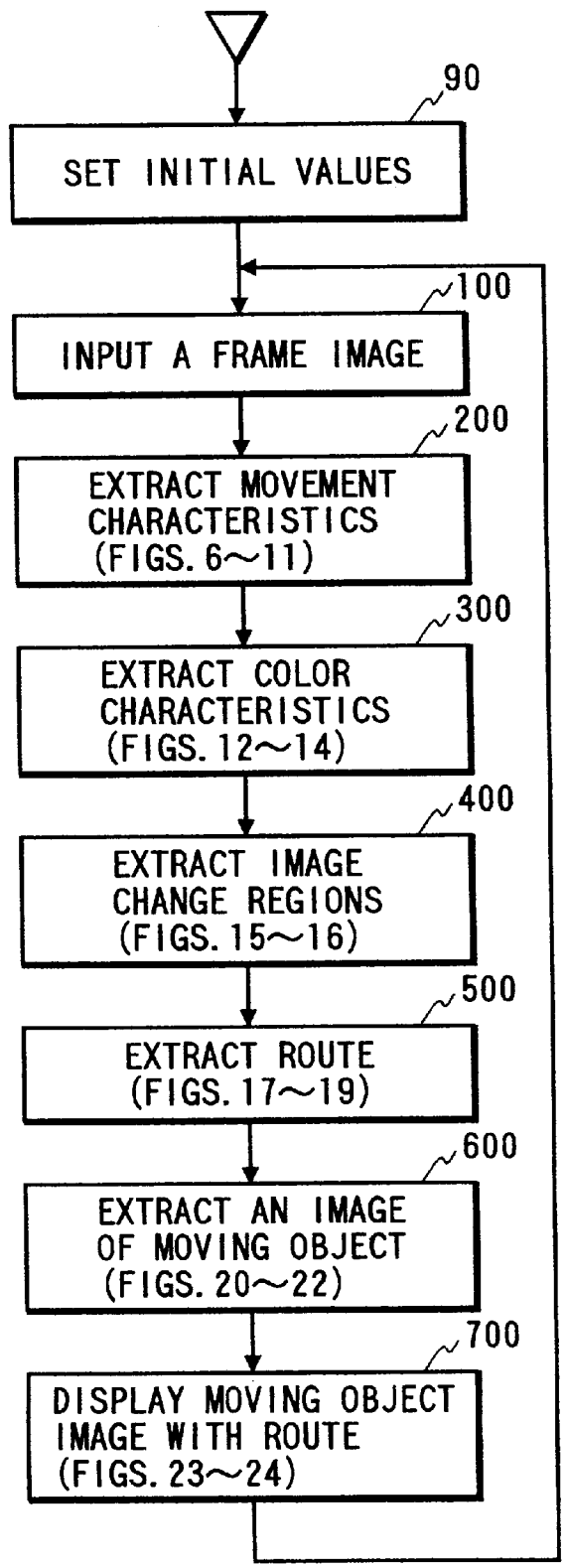
FIG. 3 is a circuit diagram illustrating a first embodiment of the level shift circuit according to the present invention.

In FIG. 3, which illustrates a first embodiment of the present invention, two cascaded CMOS inverters 1 and 2 are provided. In this case, the inverter 1 is formed by a P-channel MOS transistor $Q_{p1}$ and an N-channel MOS transistor $Q_{n1}$ and is powered by a power supply voltage $V_{DD}$ which is, for example, 12 V and a power supply voltage $V_{SS1}$ which is a negative voltage. Also, the inverter 2 is formed by a P-channel MOS transistor $Q_{p2}$ and an N-channel MOS transistor $Q_{n2}$ and is powered by the power supply voltage $V_{DD}$ and a power supply voltage $V_{SS2}$ which is 0 V.

The transistors $Q_{p1}$, $Q_{p2}$, $Q_{n1}$ and $Q_{n2}$ are formed by polycrystalline silicon TFTs. In this case, the threshold voltage $V_{thp}$ and field effect mobility $\mu_p$ of the P-channel MOS transistors are $V_{thp}$=−5 V $\mu_p$=20cm$^2$/V·s Also, the threshold voltage $V_{thn}$ and field effect mobility $\mu_n$ of the N-channel MOS transistors are $V_{thn}$=5 V $\mu_n$=40 cm$^2$/V·s In the inverter 1, the ratio $(W/L)_p$ of a channel width to a channel length of the P-channel MOS transistor $Q_{p1}$ is $(W/L)_p$=32 μm/6 μm Also, the ratio $(W/L)_n$ of a channel width to a channel length of the N-channel MOS transistor $Q_{n1}$ is $(W/L)_n$=16 μm/6 μm On the other hand, the transistor gain factor $\beta_p$ of the P-channel MOS transistor $Q_{P1}$ and the transistor gain factor $\beta_n$ of the N-channel MOS transistor $Q_{n1}$ are $\beta_p = (\mu_p \cdot \epsilon 0 \cdot \kappa 0_x) \cdot (W/L)_p / t0_x$ $\beta_n = (\mu_n \cdot \epsilon 0 \cdot \kappa 0_x) \cdot (W/L)_n / t0_x$ where ϵ0 is a permittivity of free space;

κ0$_x$ is a specific permittivity of a gate insulator; and t0$_x$ is a thickness of the gate insulator.

Therefore, in FIG. 1, $$\beta_p / \beta_n = (\mu_p / \mu_n) \cdot (W/L)_p / (W/L)_n \qquad (1)$$

$$= (20/40) \cdot (32/6)/(16/6)$$

$$= 1$$

Figure 5:
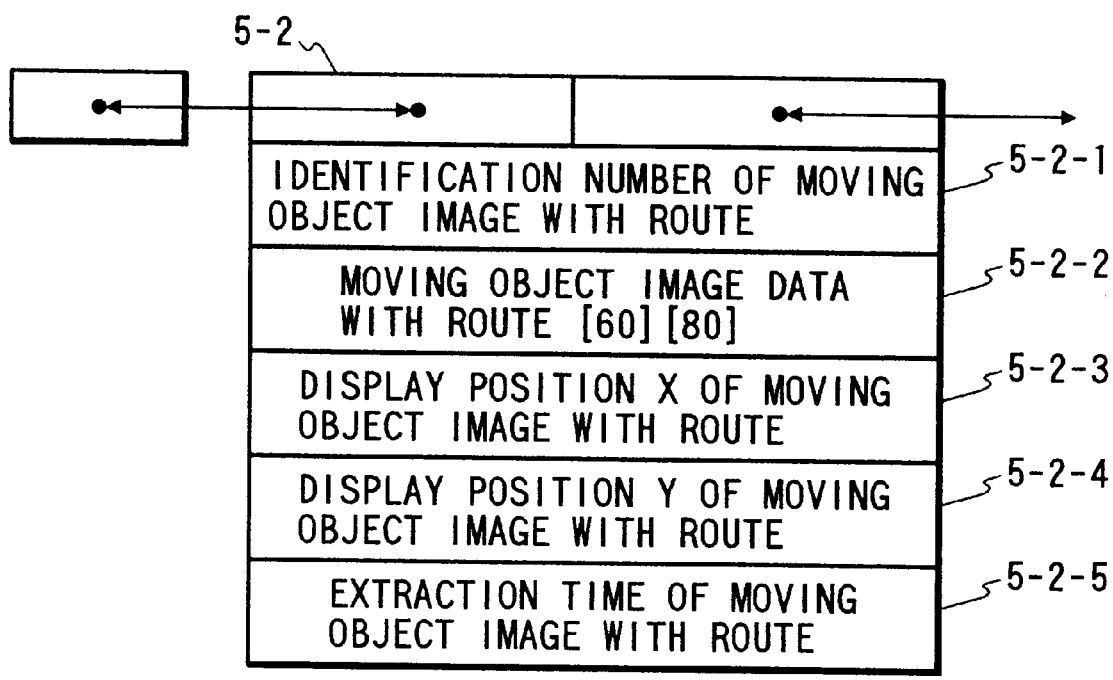
FIG. 5 is a timing diagram showing the operation of the circuit of FIG. 3.
Figure 4:
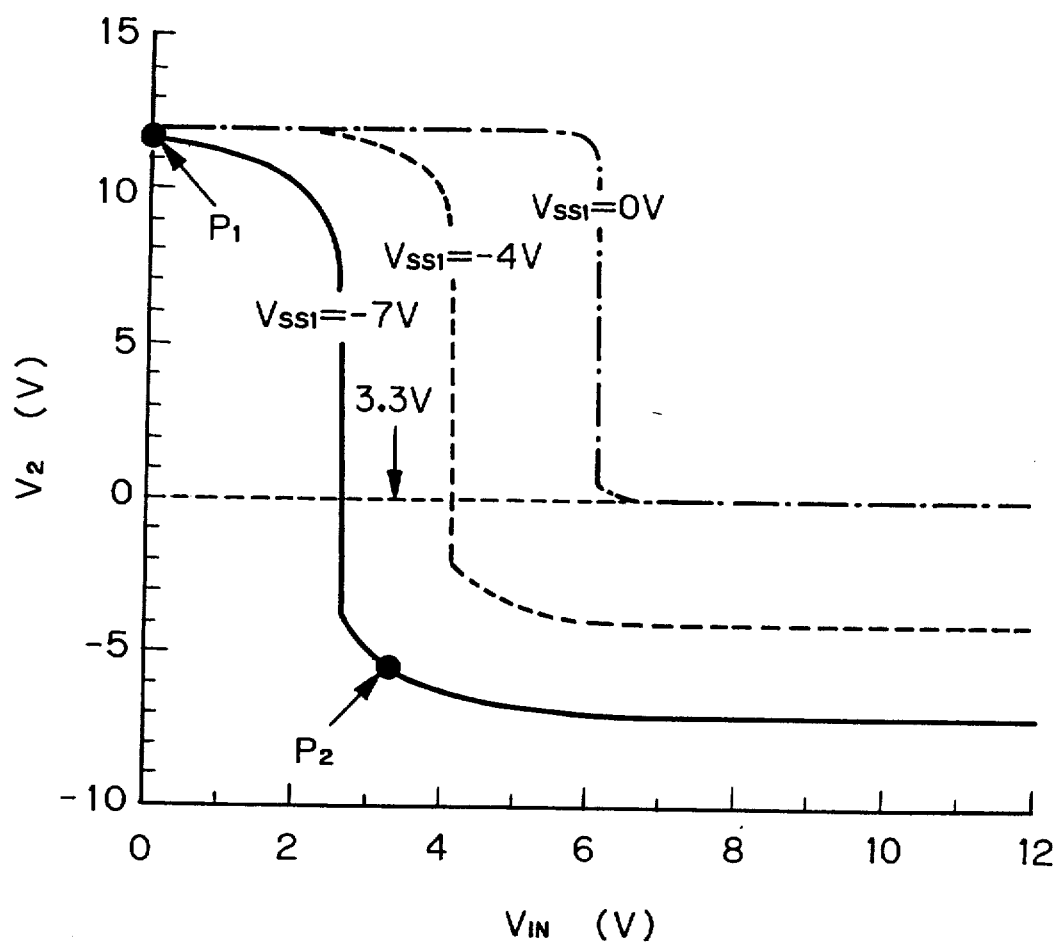
FIG. 4 is a graph showing input voltage to output voltage characteristics of the first stage inverter of FIG. 2.
Figure 5:
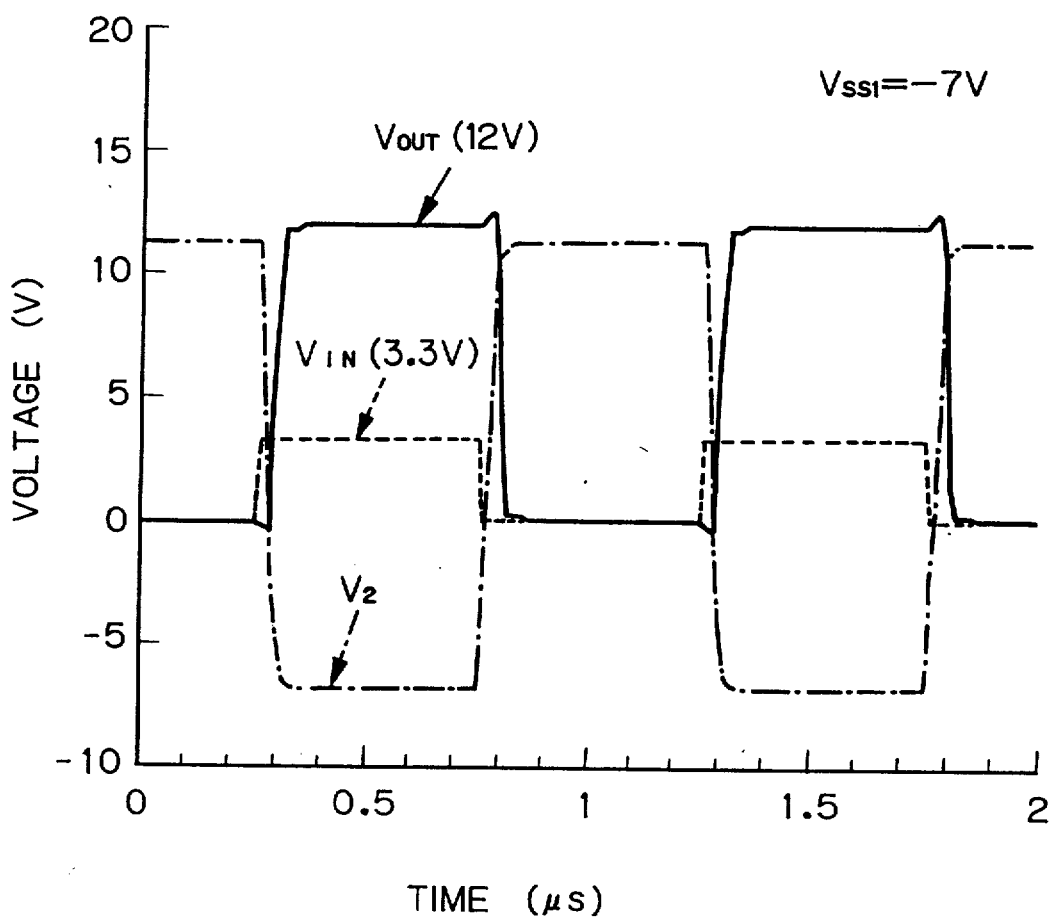
Figure 6:
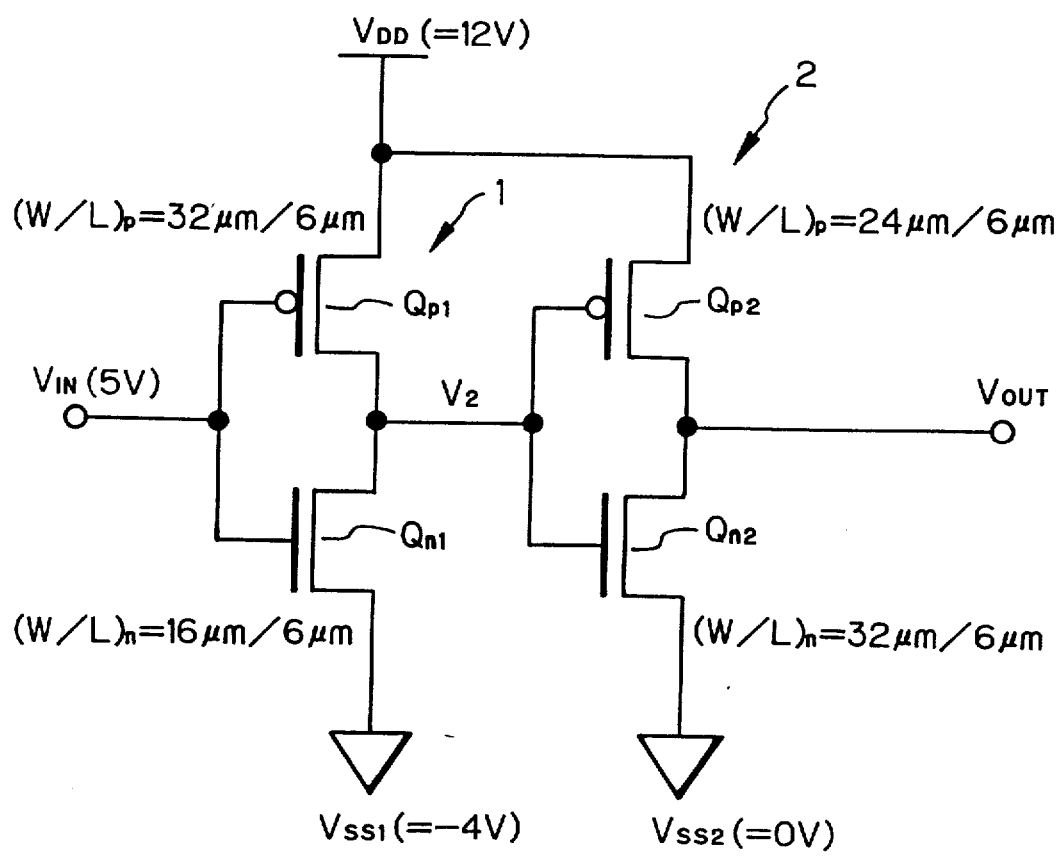
Figure 7:
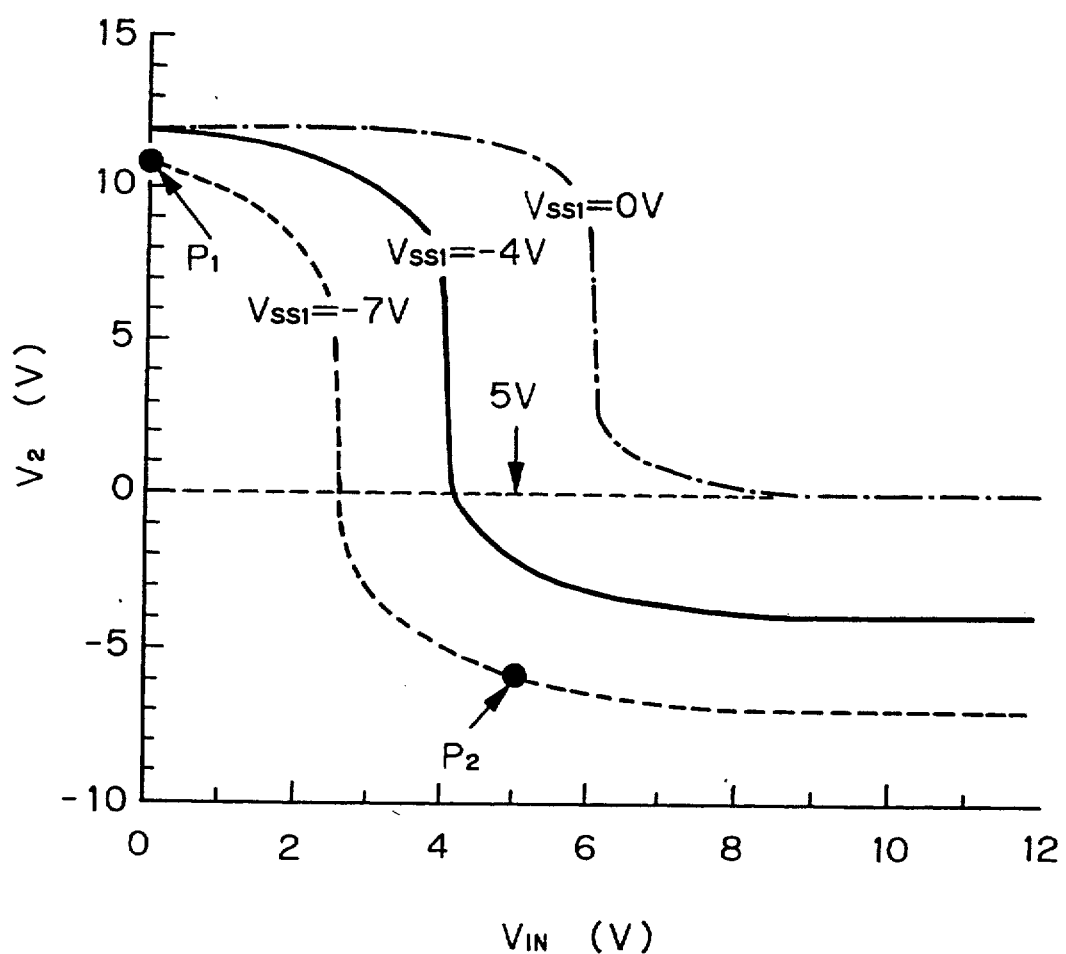
Figure 8:
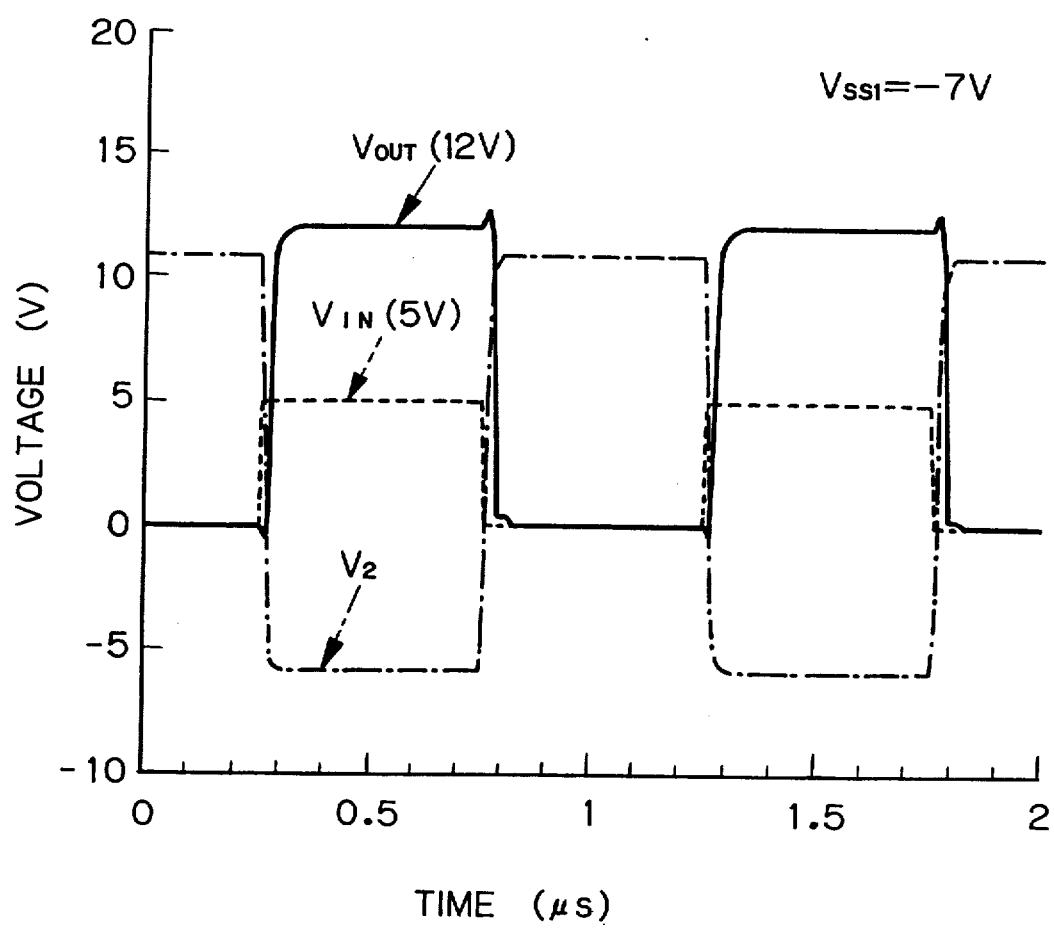
Figure 9:
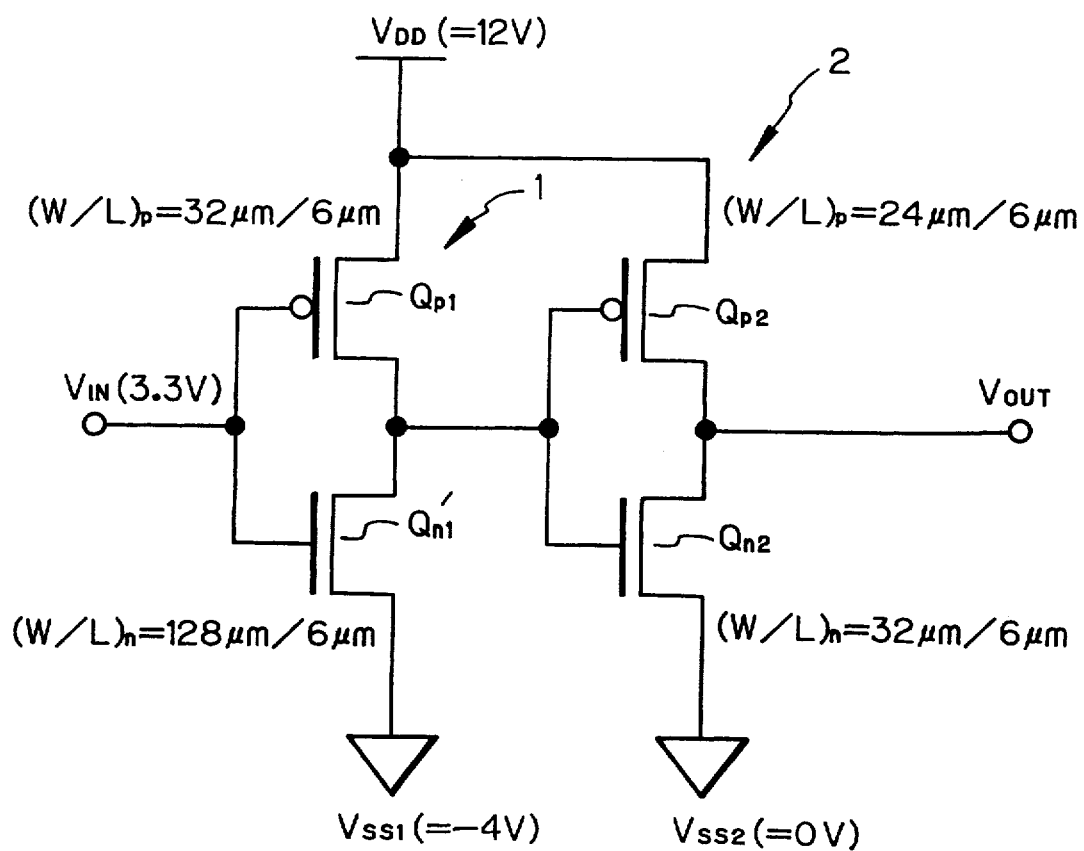
Figure 10:
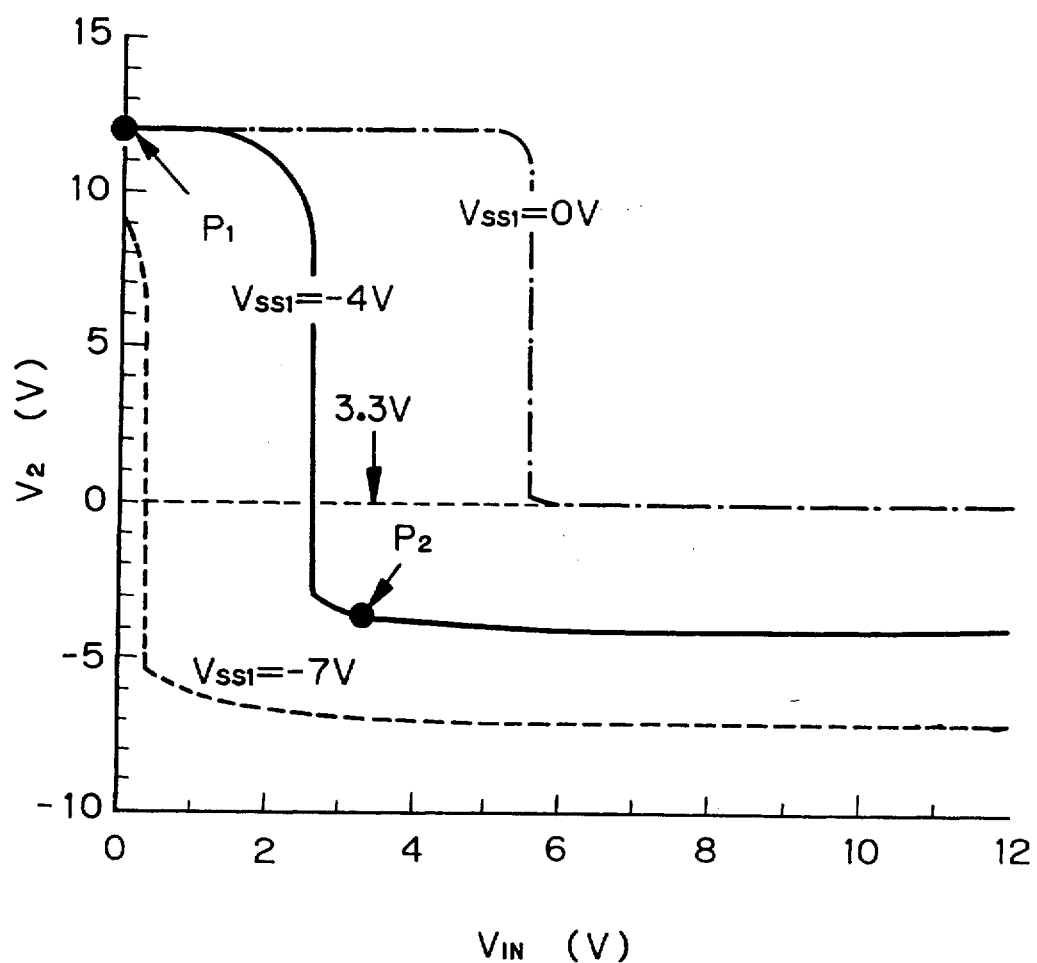
Figure 11:
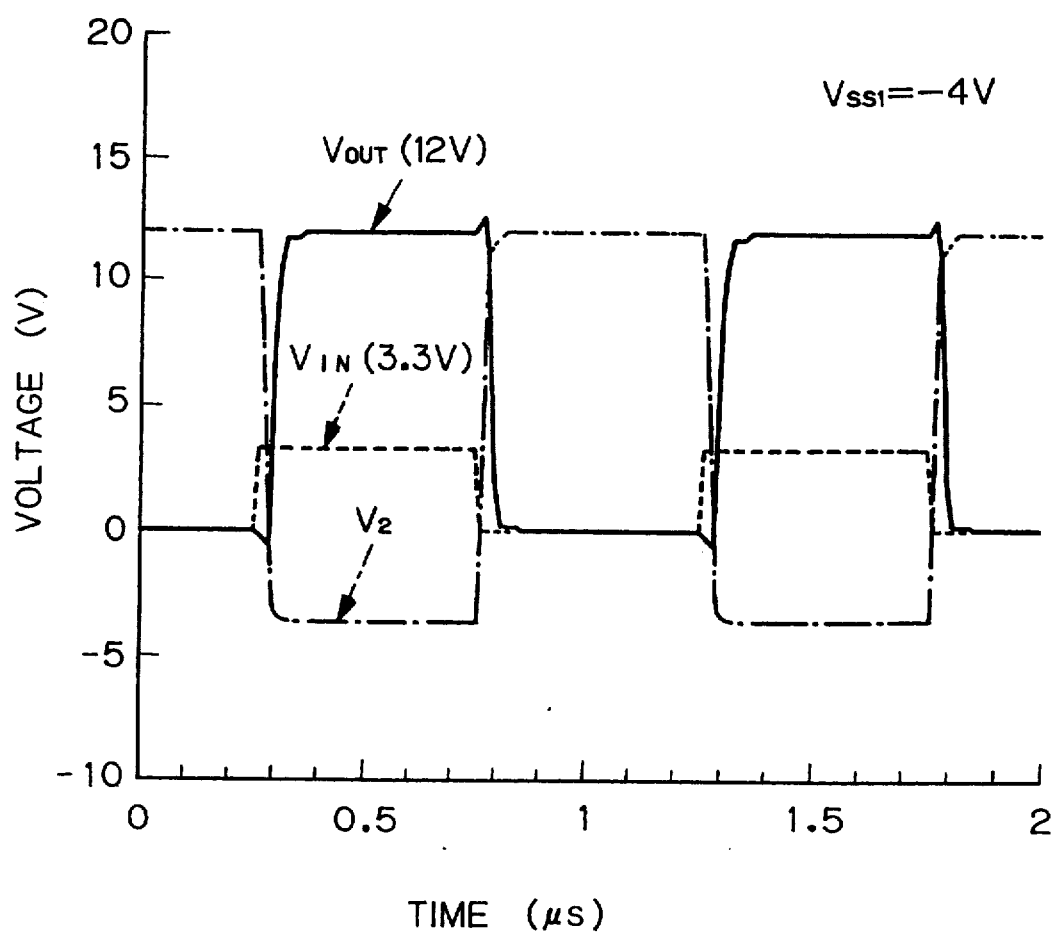
Figure 12:
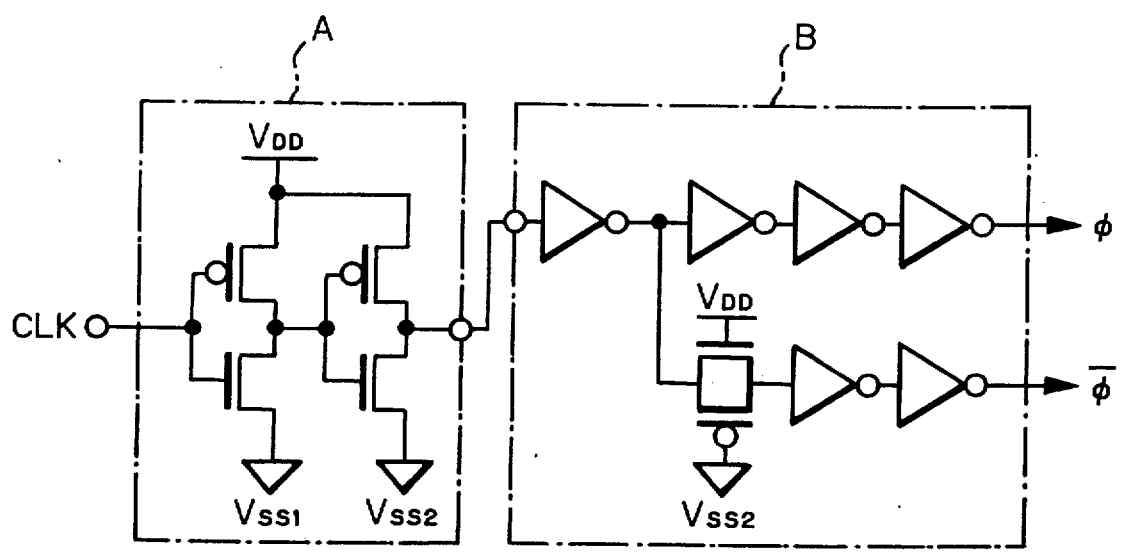

As shown in FIG. 4, which shows the input voltage to output voltage characteristics of the inverter 1 of FIG. 3, the lower the threshold voltage of the inverter 1, the lower the power supply voltage $V_{SS1}$. Particularly, when $V_{SS1}$ is −7 V, the threshold voltage of the inverter 1 is lower than 3.3 V. Therefore, if the input voltage $V_{IN}$ is 0 V and 3.3 V as indicated by operating points $P_1$ and $P_2$ in FIG. 4, the output voltage $V_2$ is 11.7 V and −5.5 V, respectively. The high and low levels (11.7 V and −5.5 V) of the output voltage $V_2$ of the inverter 1 can surely operate the inverter 2, so that the output voltage $V_{OUT}$ is $V_{SS2}$(=0 V) and $V_{DD}$ (=12 V), as shown in FIG. 5.

In the inverter 2, in order to make the driving power of the P-channel MOS transistor $Q_{p2}$ is made equal to that of the N-channel MOS transistor $Q_{n2}$, the ratio $(W/L)_p$ of a channel width to a channel length of the P-channel MOS transistor $Q_{p2}$ is $(W/L)_p$=24 μm/6 μm Also, the ratio $(W/L)_n$ of a channel width to a channel length of the N-channel MOS transistor $Q_{n2}$ is $(W/L)_n$=32 μm/6 μm Thus, even if the absolute values of threshold voltages of the MOS transistors are large, for example, 5 V, a voltage of 3.3 V can be changed to a voltage of 12 V. In the first embodiment, note that the sum of the absolute value of the threshold voltage $V_{thp}$ and the threshold voltage $V_{thn}$ is larger than the input voltage $V_{IN}$, i.e., $$|V_{thp}|+V_{thn}=5 \text{ V}+5 \text{ V}>V_{IN}(=3.3 \text{ V}) \qquad (2)$$

Figure 6:
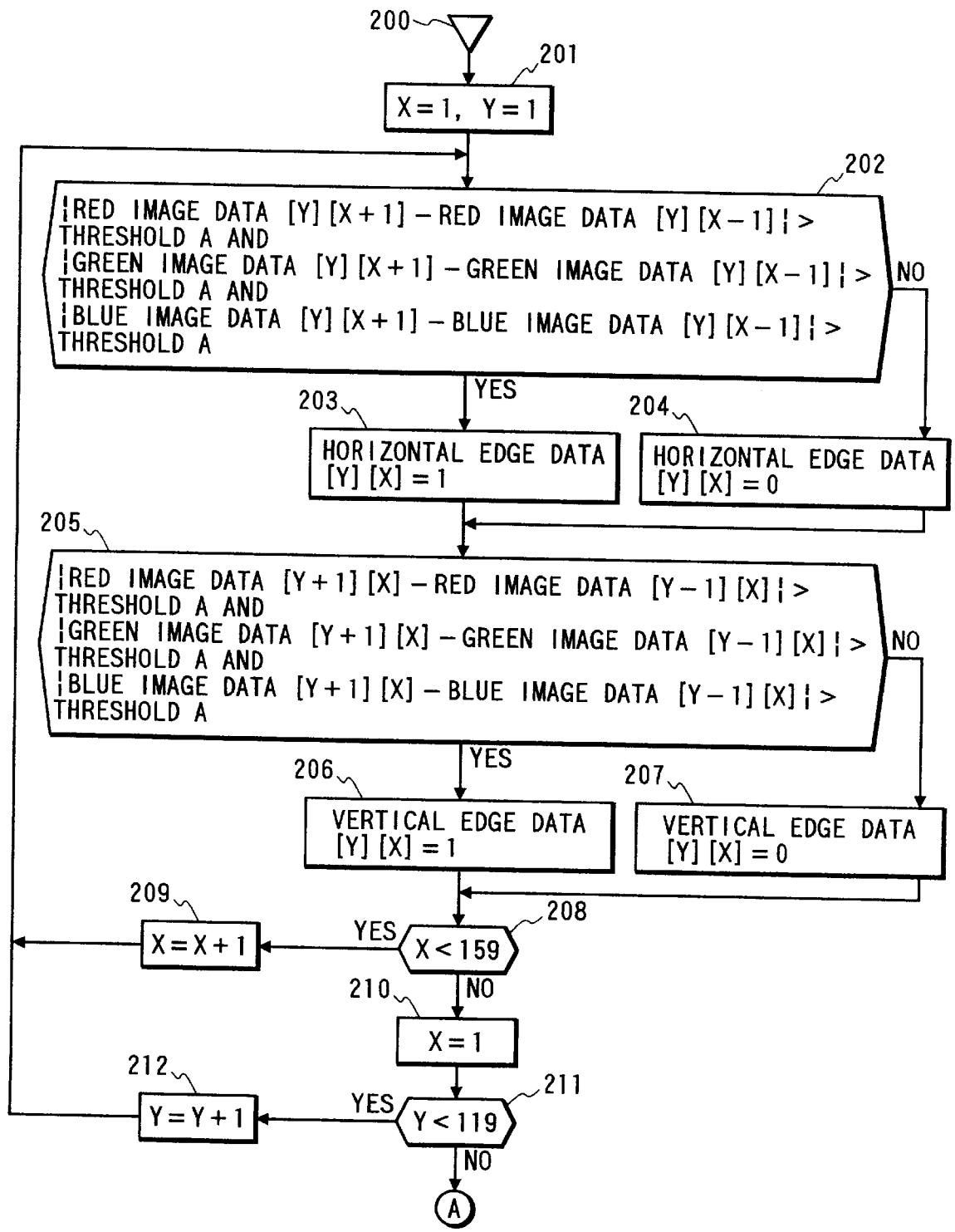
FIG. 6 is a circuit diagram illustrating a second embodiment of the level shift circuit according to the present invention.
Figure 7:
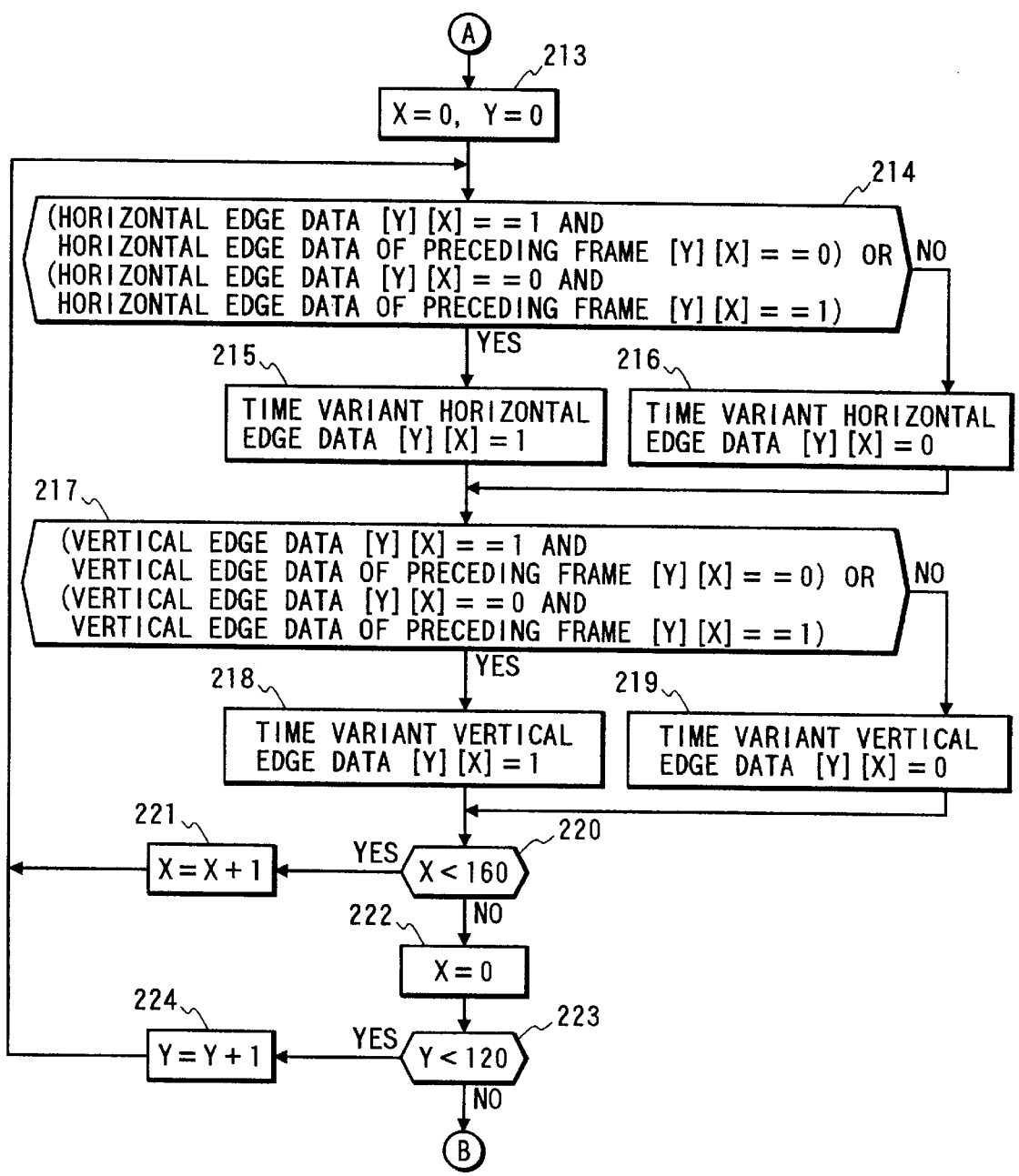
FIG. 7 is a graph showing input voltage to output voltage characteristics of the first stage inverter of FIG. 6.
Figure 8:
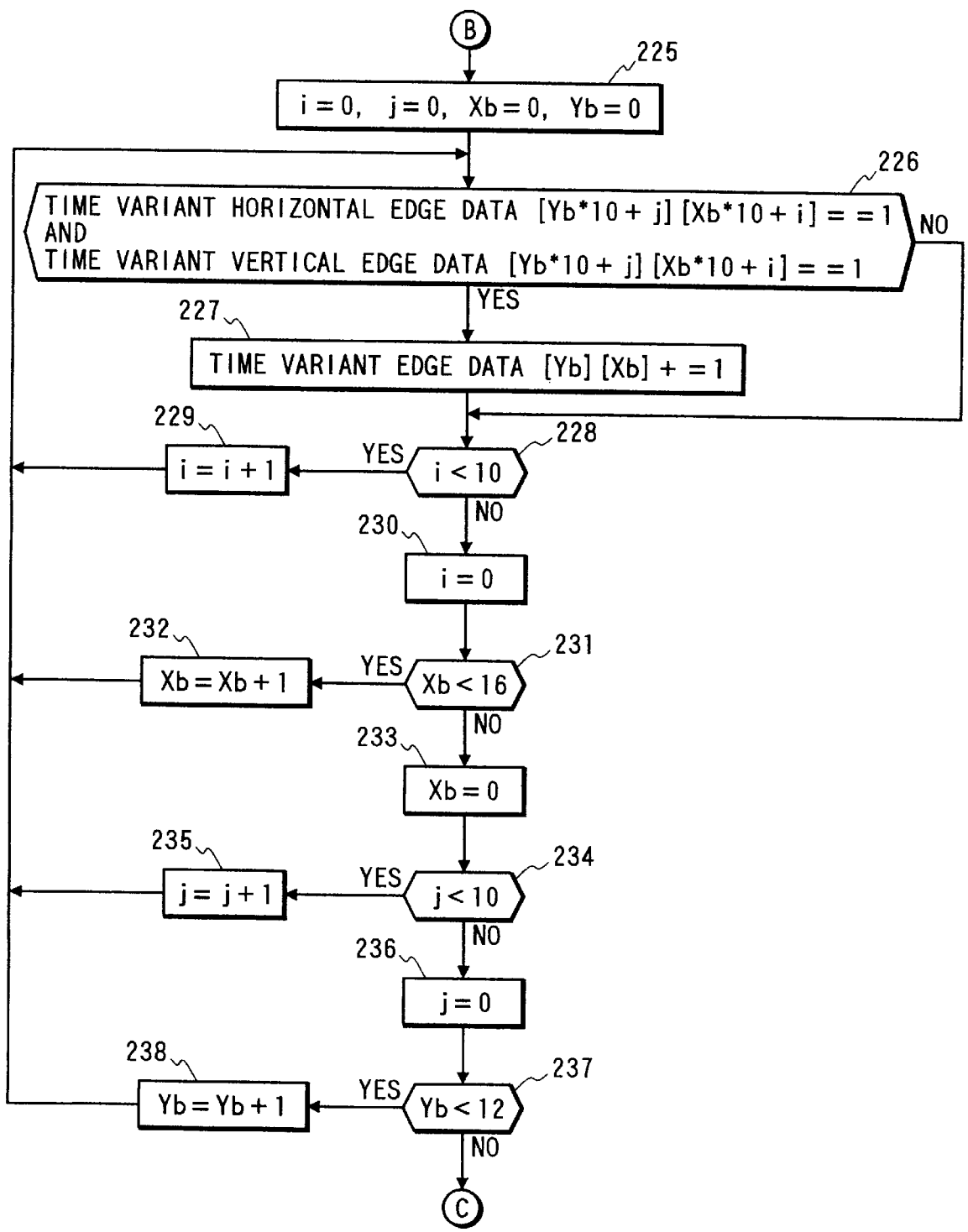
FIG. 8 is a timing diagram showing the operation of the circuit of FIG. 6.

In FIG. 6, which illustrates a second embodiment of the present invention, the threshold voltages $V_{thp}$ and $V_{thn}$ are different from those of the first embodiment. That is, the threshold voltage $V_{thp}$ and field effect mobility $\mu_p$ of the P-channel MOS transistors are $V_{thp}$=−2.4 V $\mu_p$=20 cm$^2$V·s Also, the threshold voltage $V_{thn}$ and field effect mobility $\mu_n$ of the N-channel MOS transistors are $V_{thn}$=2.4 V $\mu_n$=40 cm$^2$/V·s As shown in FIG. 7, which shows the input voltage to output voltage characteristics of the inverter 1 of FIG. 6, the lower the threshold voltage of the inverter 1, the lower the power supply voltage $V_{SS1}$. Particularly, when $V_{SS1}$ is −5 V, the threshold voltage of the inverter 1 is lower than 5 V. Therefore, if the input voltage $V_{IN}$ is 0 V and 5 V as indicated by operating points $P_1$ and $P_2$ in FIG. 7, the output voltage $V_2$ is 11.7 V and −5.8 V, respectively. The high and low levels (11.7 V and −5.8 V) of the output voltage $V_2$ of the inverter 1 can surely operate the inverter 2, so that the output voltage $V_{OUT}$ is $V_{SS2}$(=0 V) and $V_{DD}$(=12 V), as shown in FIG. 8.

Thus, even if the absolute values of threshold voltages of the MOS transistors are small, for example, 2.4 V, a voltage of 5 V can be changed to a voltage of 12 V. In the second embodiment, note that the sum of the absolute value of the threshold. voltage $V_{thp}$ and the threshold voltage $V_{thn}$ is smaller than the input voltage $V_{IN}$, i.e., $$|V_{thp}|+V_{thn}=2.4\ V+2.4\ V<V_{IN}(=5\ V) \quad (3)$$

The condition (3) can also be obtained by the level shift circuit of FIG. 1. However, since the sizes of the N-channel MOS transistors $Q_{n1}$ and $Q_{n2}$ of FIG. 6 are remarkably smaller than those of the N-channel MOS transistors $Q_{n12}$ and $Q_{n13}$ of FIG. 1, the level shift circuit of FIG. 6 is excellent in view of the integration as compared with that of FIG. 1.

Figure 9:
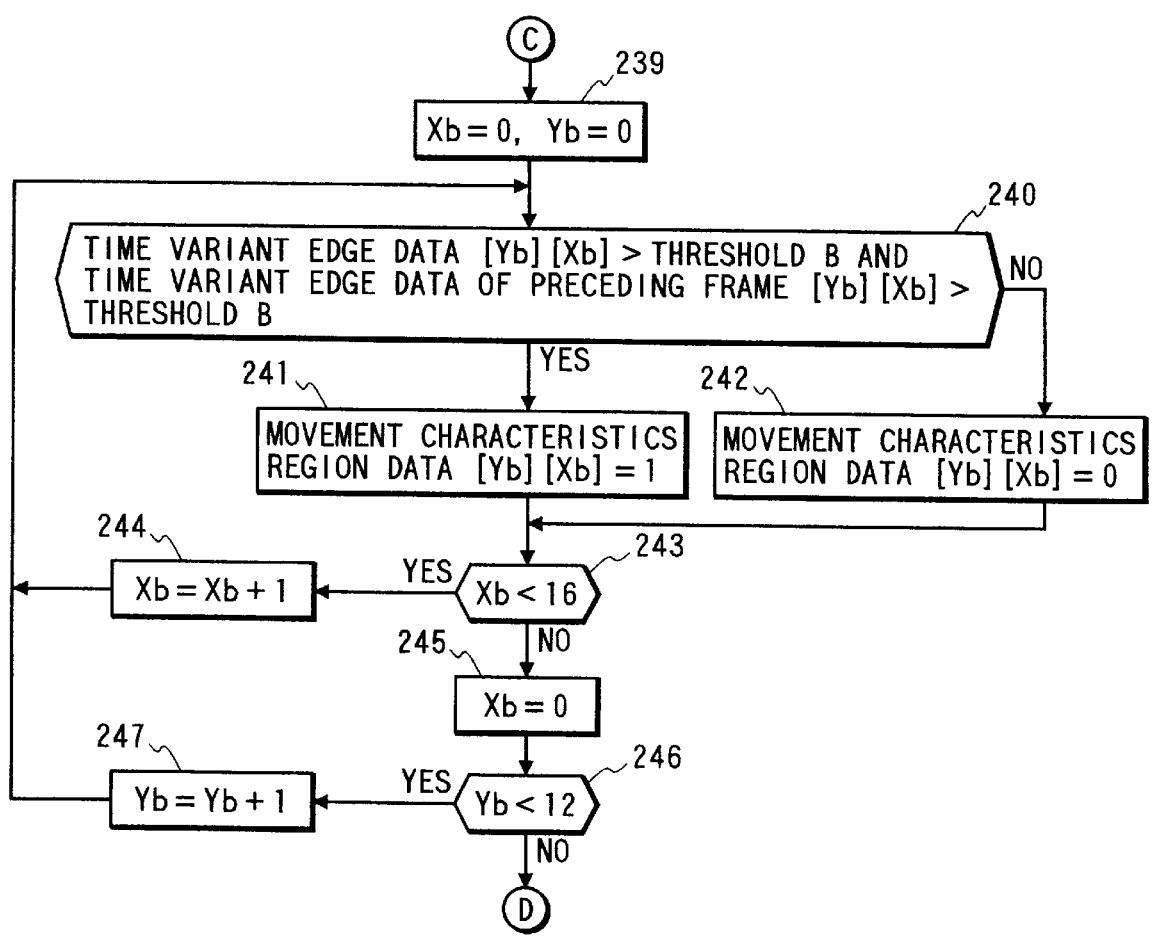
FIG. 9 is a circuit diagram illustrating a first embodiment of the level shift circuit according to the present invention.

In FIG. 9, which illustrates a third embodiment of the present invention, the N-channel MOS transistor $Q_{n1}$ of FIG. 3 is modified to an N-channel MOS transistor $Q_{n1}'$. That is, the ratio $(W/L)_n$ of a channel width to a channel length of the N-channel MOS transistor $Q_{n1}'$ is $(W/L)_n=128\ \mu m/6\ \mu m$ Therefore, in FIG. 9, $$\beta_p/\beta_n = (\mu_p/\mu_n)\cdot(W/L)_p/(W/L)_n \quad (4)$$
$$= (20/40)\cdot(32/6)/(128/6)$$
$$= 1/8$$

Figure 10:
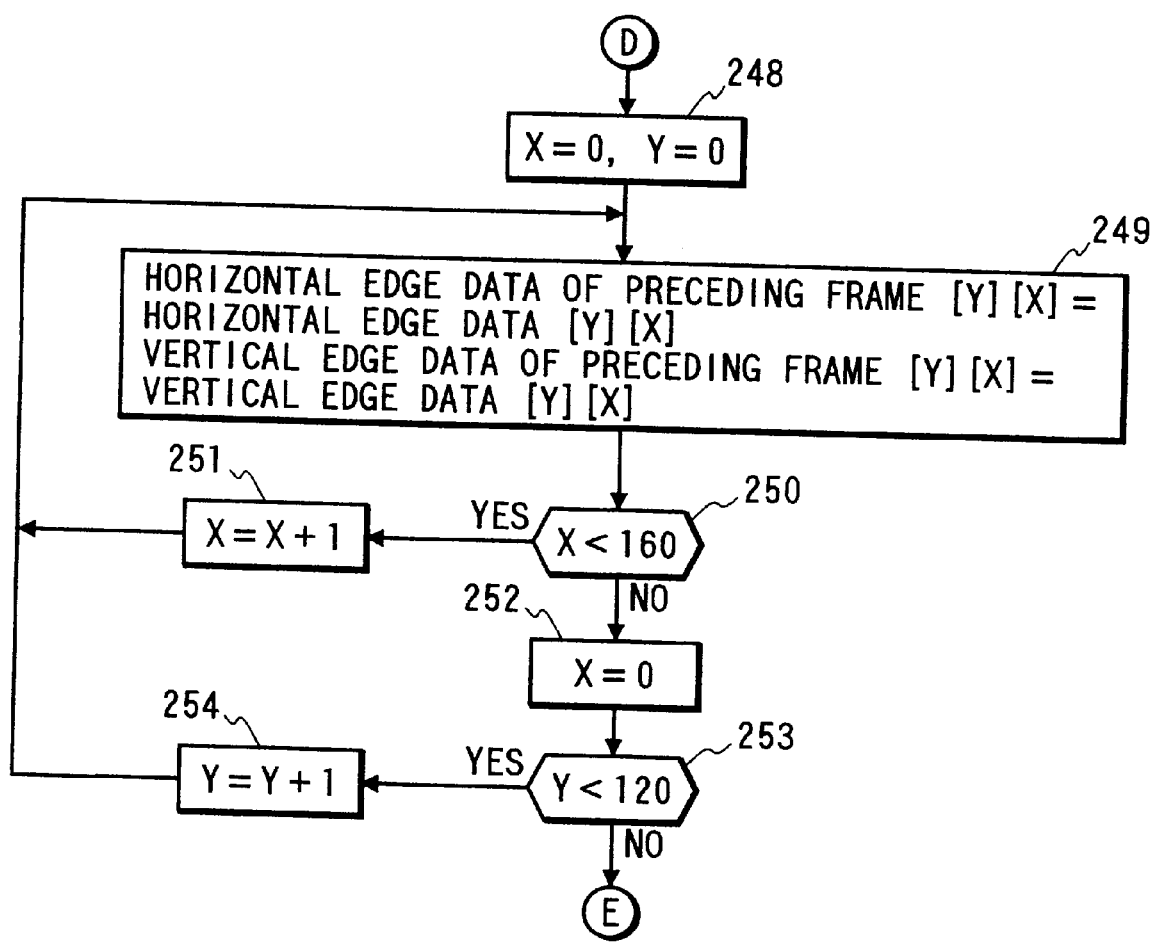
FIG. 10 is a graph showing input voltage to output voltage characteristics of the first stage inverter of FIG. 9.
Figure 11:
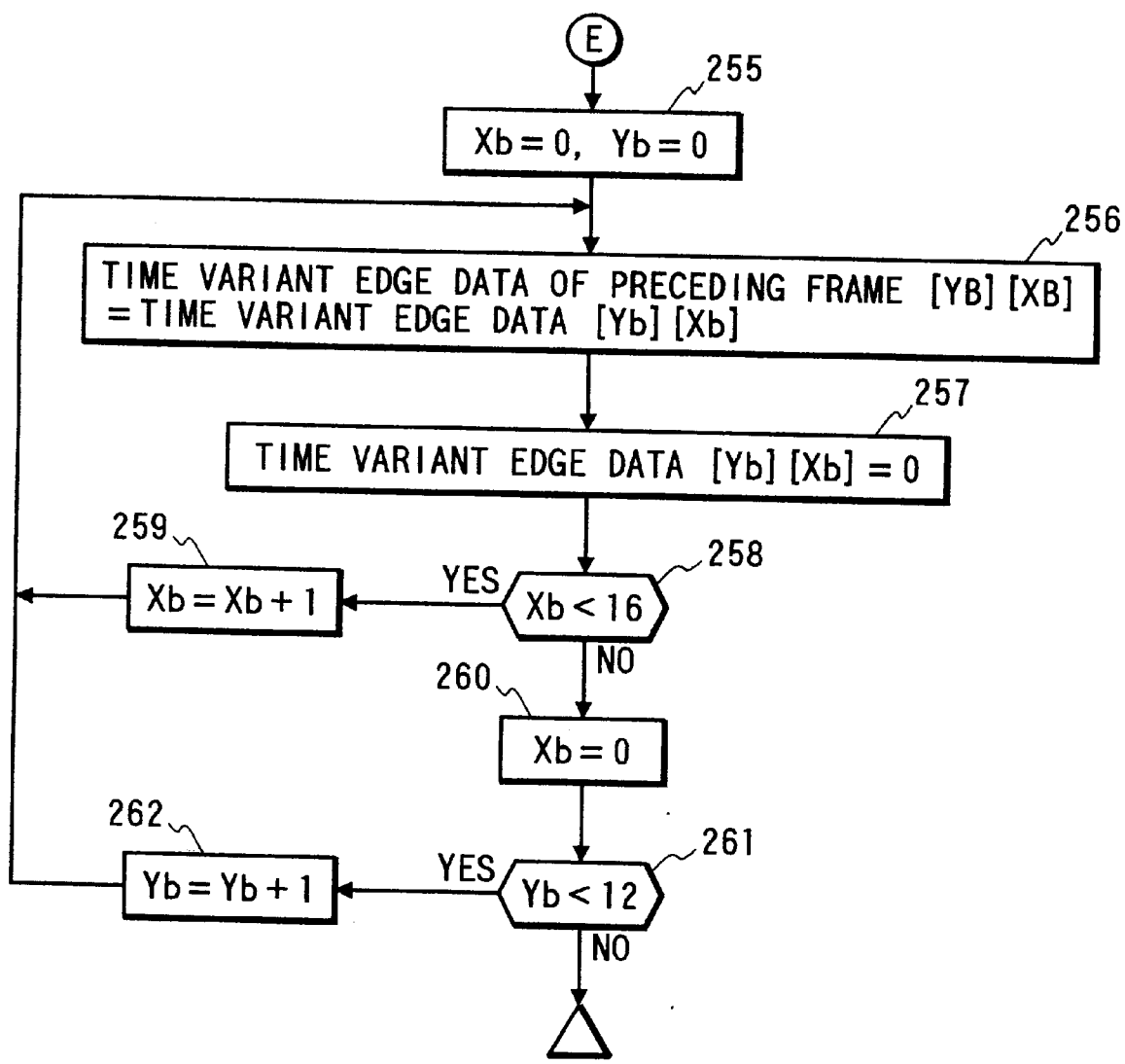
FIG. 11 is a timing diagram showing the operation of the circuit of FIG. 9.

As shown in FIG. 10, which shows the input voltage to output voltage characteristics of the inverter 1 of FIG. 9, the lower the threshold voltage of the inverter 1, the lower the power supply voltage $V_{SS1}$. Particularly, when $V_{SS1}$ is −4 V, the threshold voltage of the inverter 1 is lower than 3.3 V. Therefore, if the input voltage $V_{IN}$ is 0 V and 3.3 V as indicated by operating points $P_1$ and $P_2$ in FIG. 10, the output voltage $V_2$ is 11.7 V and −3.8 V, respectively. The high and low levels (11.7 V and −3.8 V) of the output voltage $V_2$ of the inverter 1 can surely operate the inverter 2, so that the output voltage $V_{OUT}$ is $V_{SS2}(=0\ V)$ and $V_{DD}$ (=12 V), as shown in FIG. 11.

Thus, in the third embodiment, an input voltage $V_{IN}$ having a voltage swing of 3.3 V can be changed to an output voltage $V_{out}$ having a voltage swing of 12 V by using the power supply voltage $V_{SS1}$ (=−4 V) smaller than that of the first embodiment.

In the third embodiment, the transistor gain factor rating $\beta_p/\beta_n$ can be a value other than ⅛. In this case, the smaller the transistor gain factor ratio $\beta_p/\beta_n$, the larger the power supply voltage $V_{SS1}$. In this case, however, when the transistor gain factor ratio $\beta_p/\beta_n$ is too small, a larger leakage current in case of $V_{IN}$=0 V flows through the transistor $Q_{n1}'$.

In the above-described embodiments, although the power supply voltage $V_{DD}$ is 12 V, the present invention can be applied to a power supply voltage $V_{DD}$ where $V_{DD}$ is higher than $V_{IN}$. In addition, a voltage other than 0 V can be set in the power supply voltage $V_{SS2}$. That is, the power supply voltage $V_{SS2}$ can be a positive voltage or a negative voltage, which is adapted to the driving condition of a peripheral driving circuit such as a scanning circuit and a sample/hold circuit. Further, the MOS transistors $Q_{p1}$, $Q_{p2}$, $Q_{n1}$ and $Q_{n2}$ can be formed by amorphous silicon TFTs and cadmium selenium (CdSe) TET in addition to polycrystalline silicon TETs.

Figure 12:
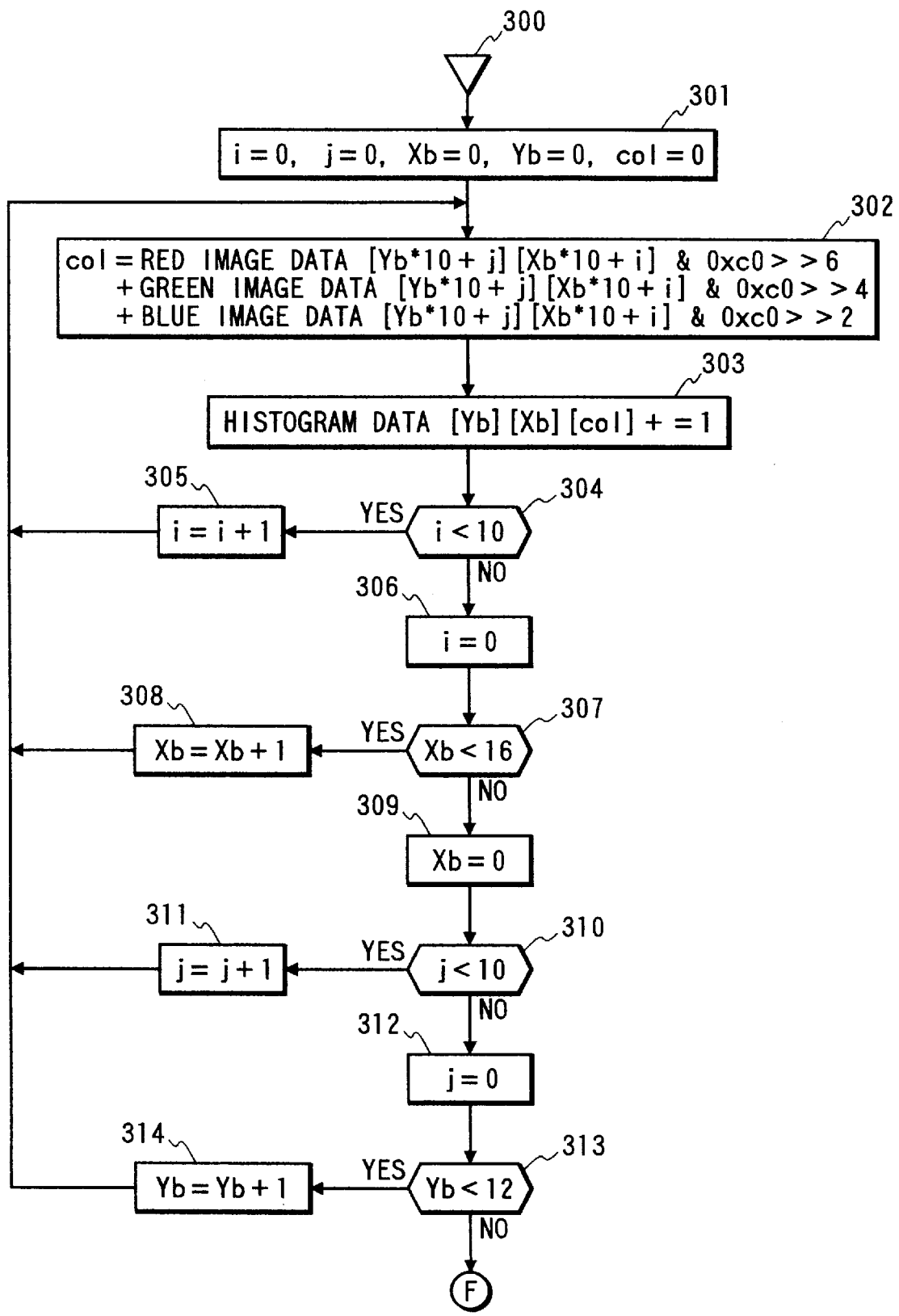
FIG. 12 is a circuit diagram illustrating a circuit to which the level shift circuit of the present invention is applied.
Figure 13:
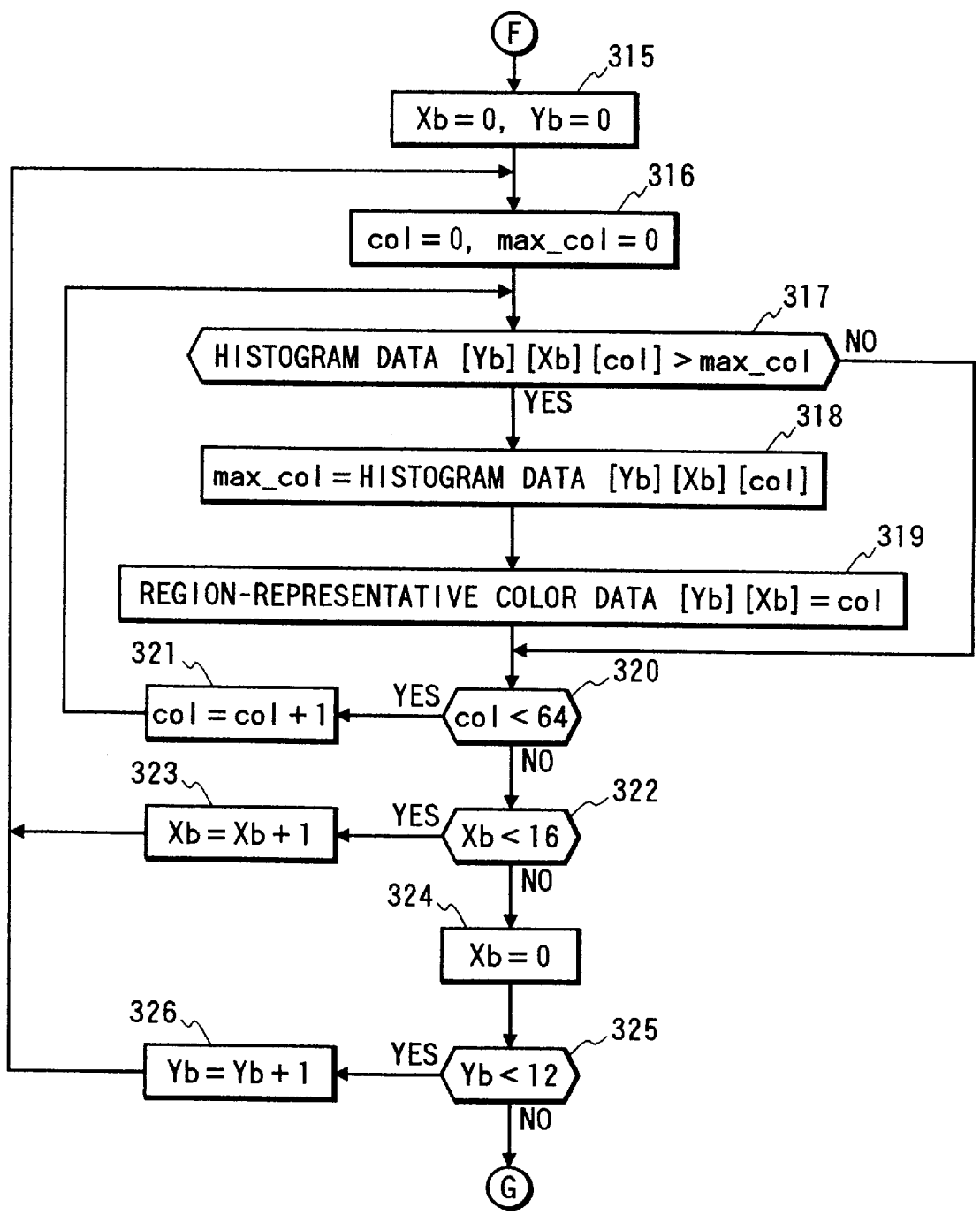
Figure 14:
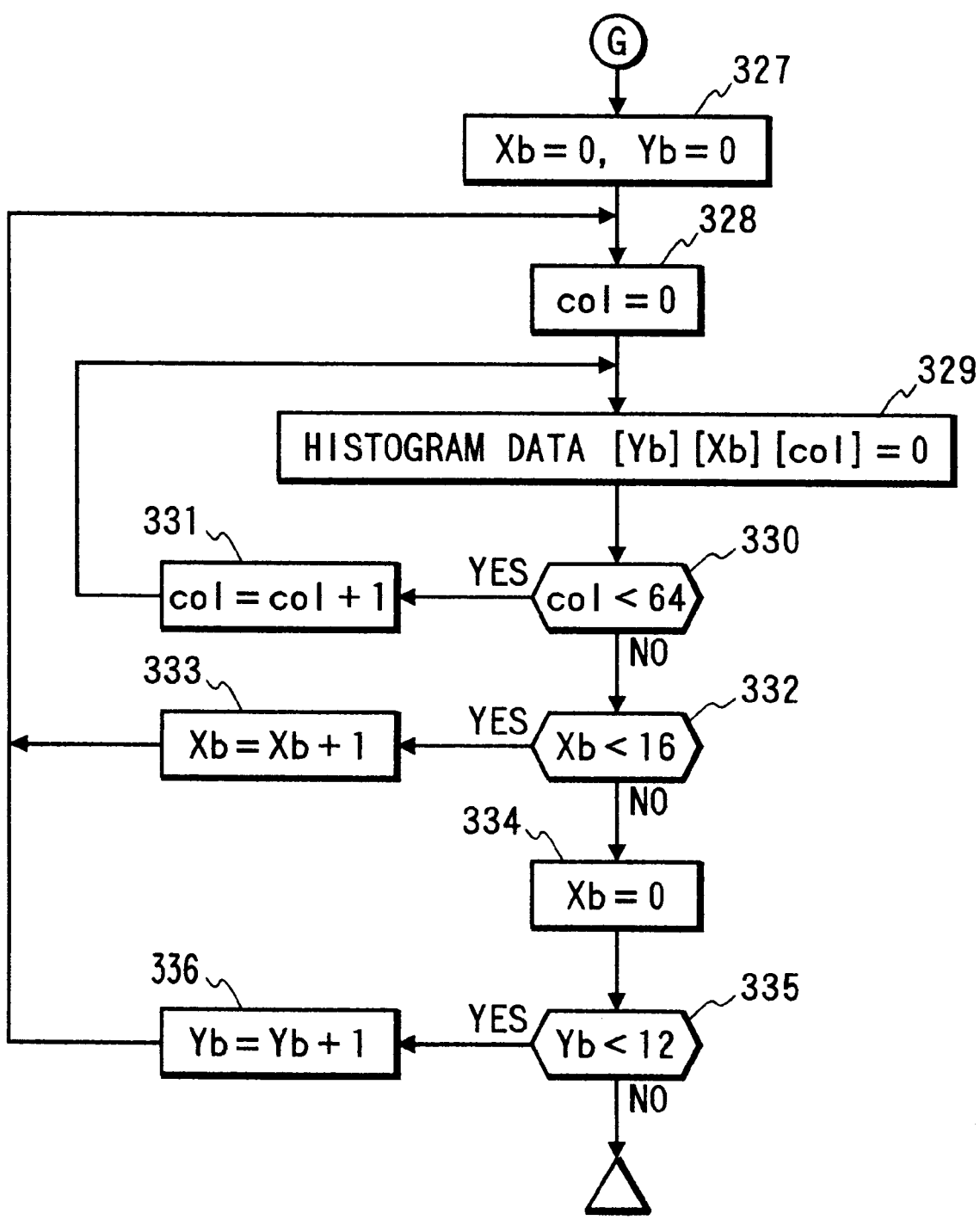
Figure 15:
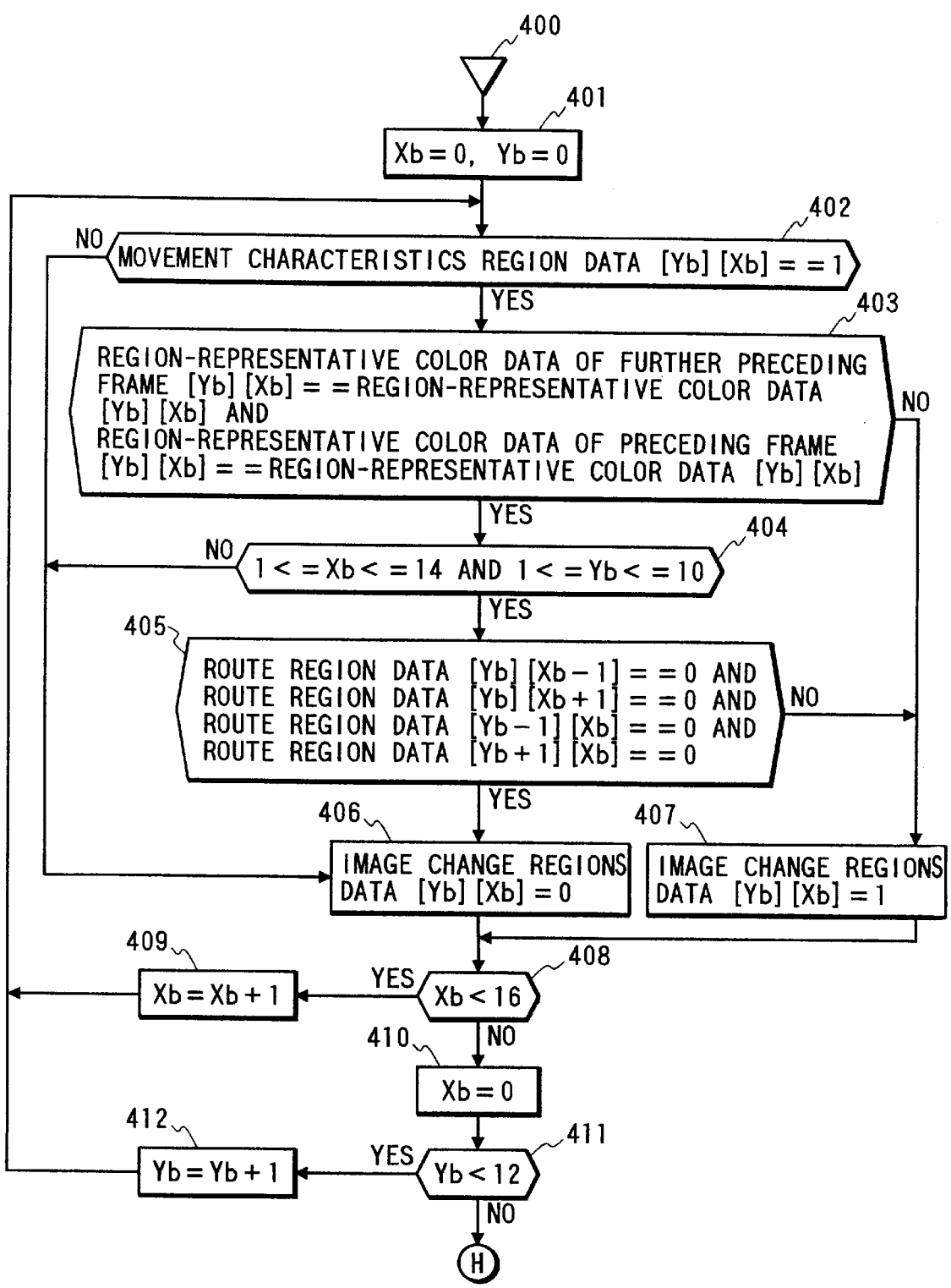
Figure 16:
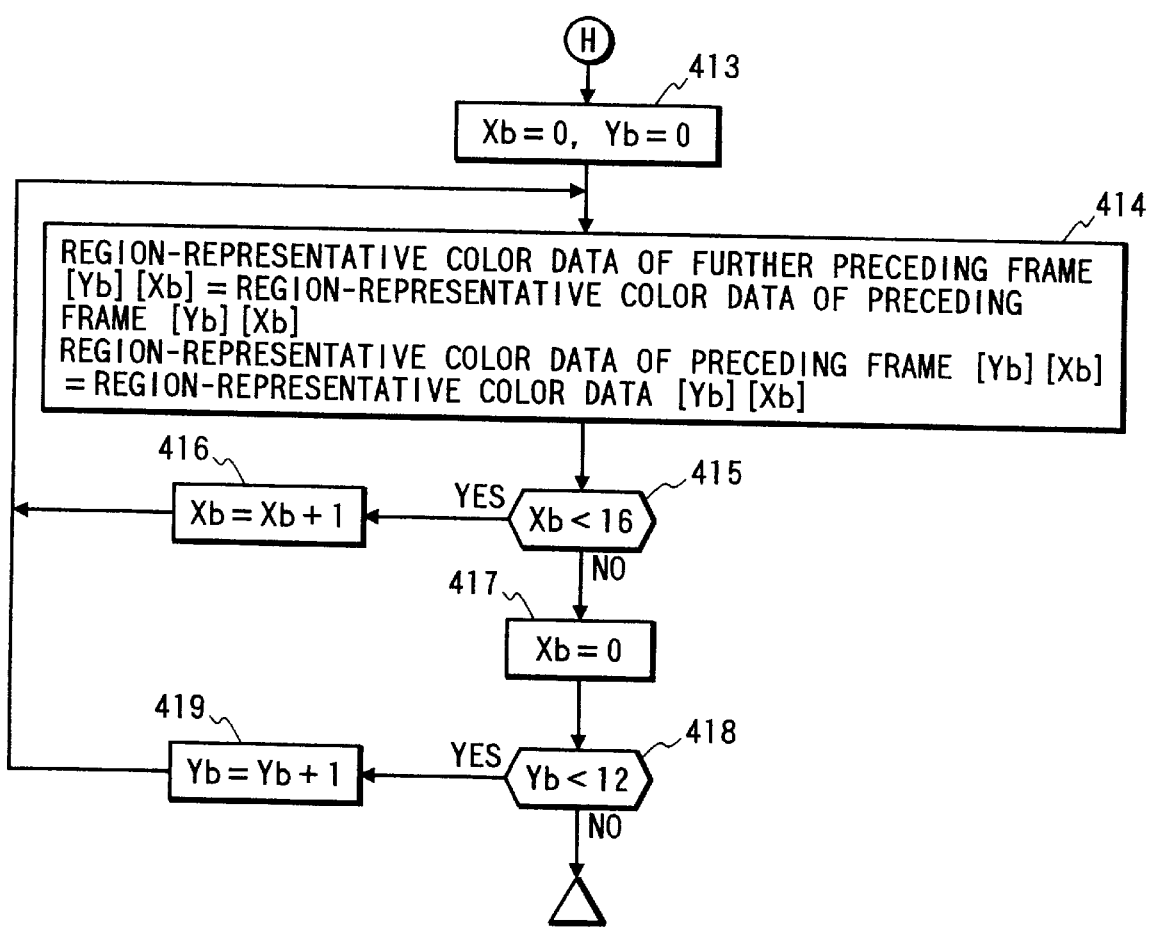
Figure 17:
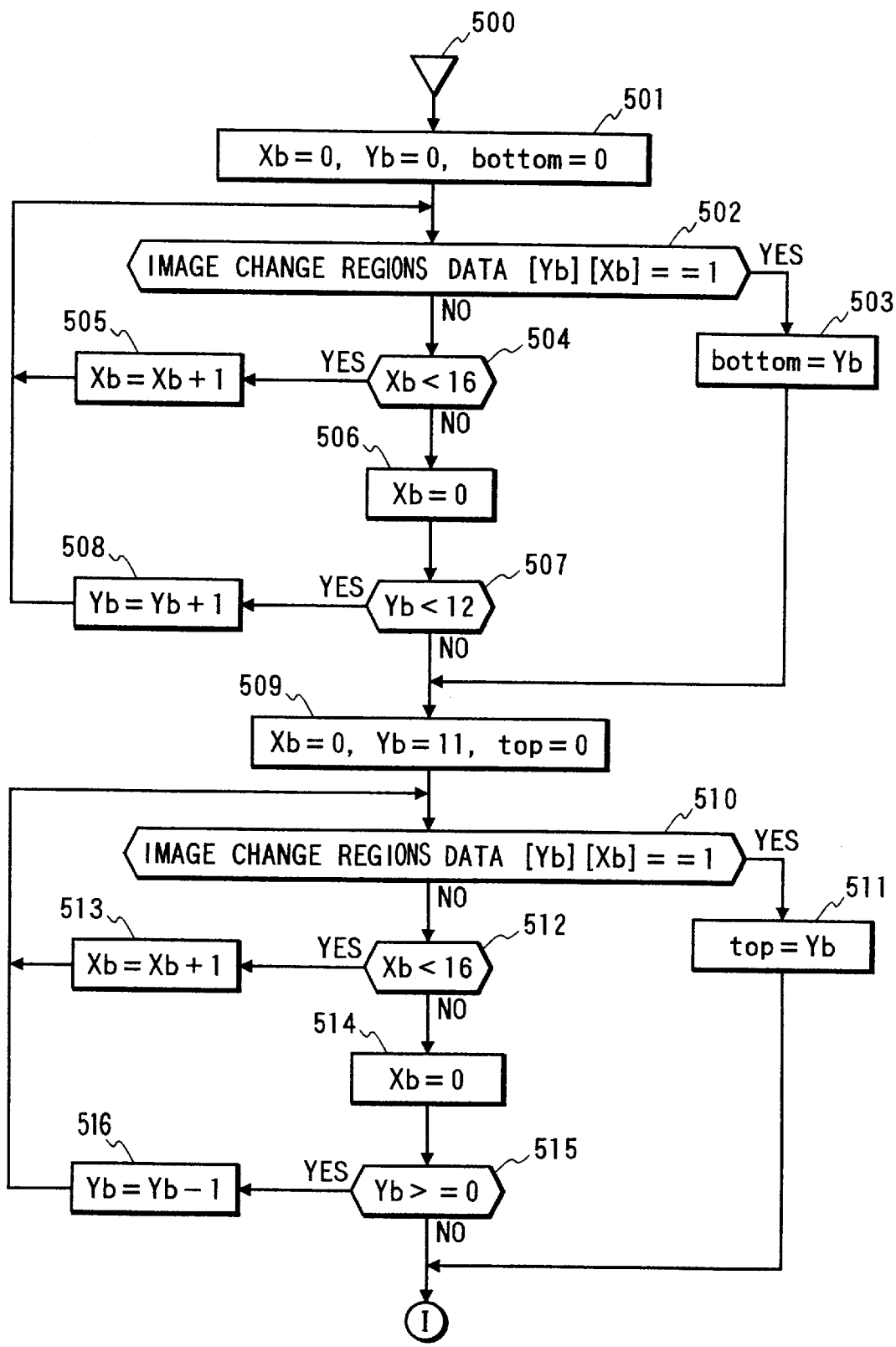
Figure 18:
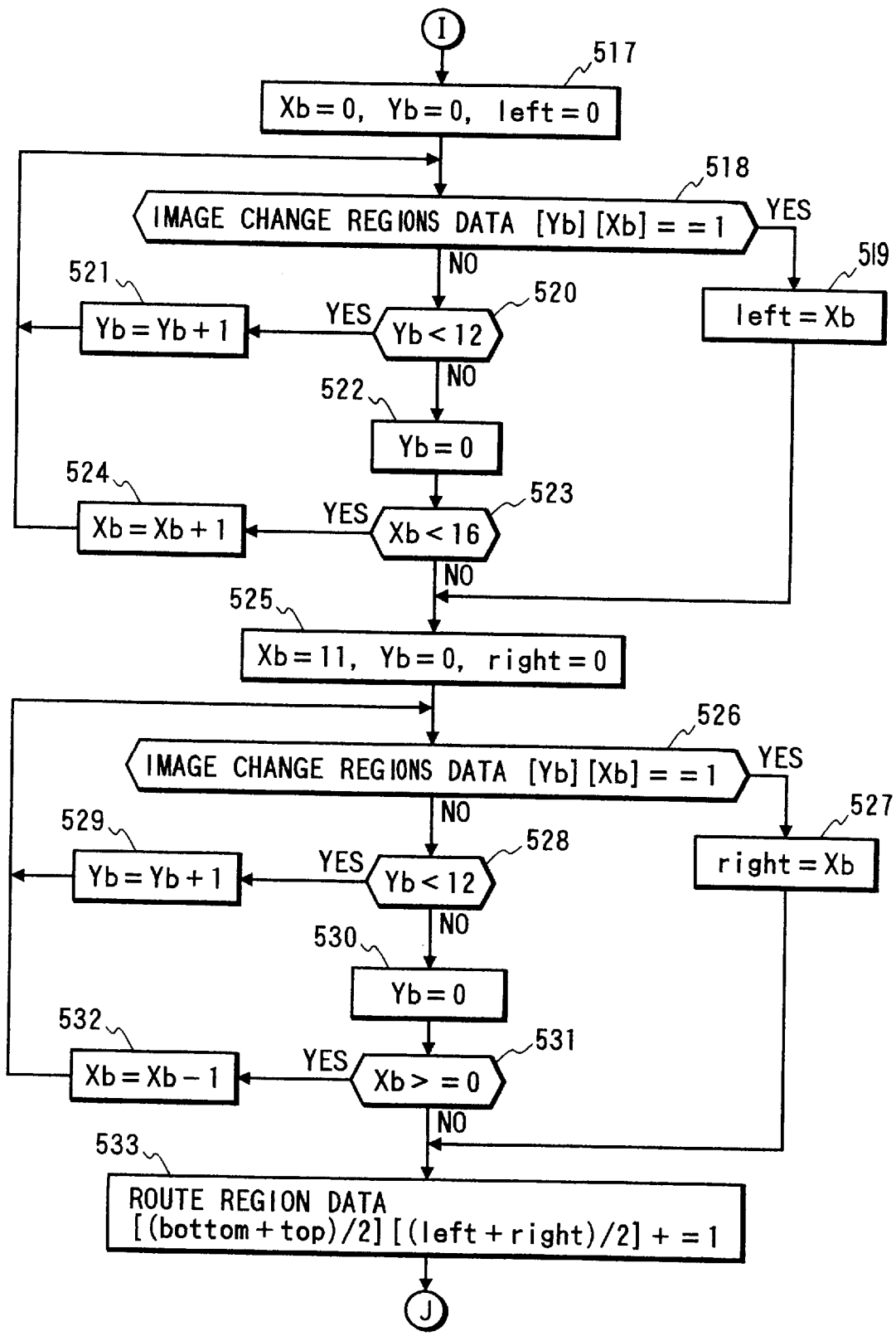
Figure 19:
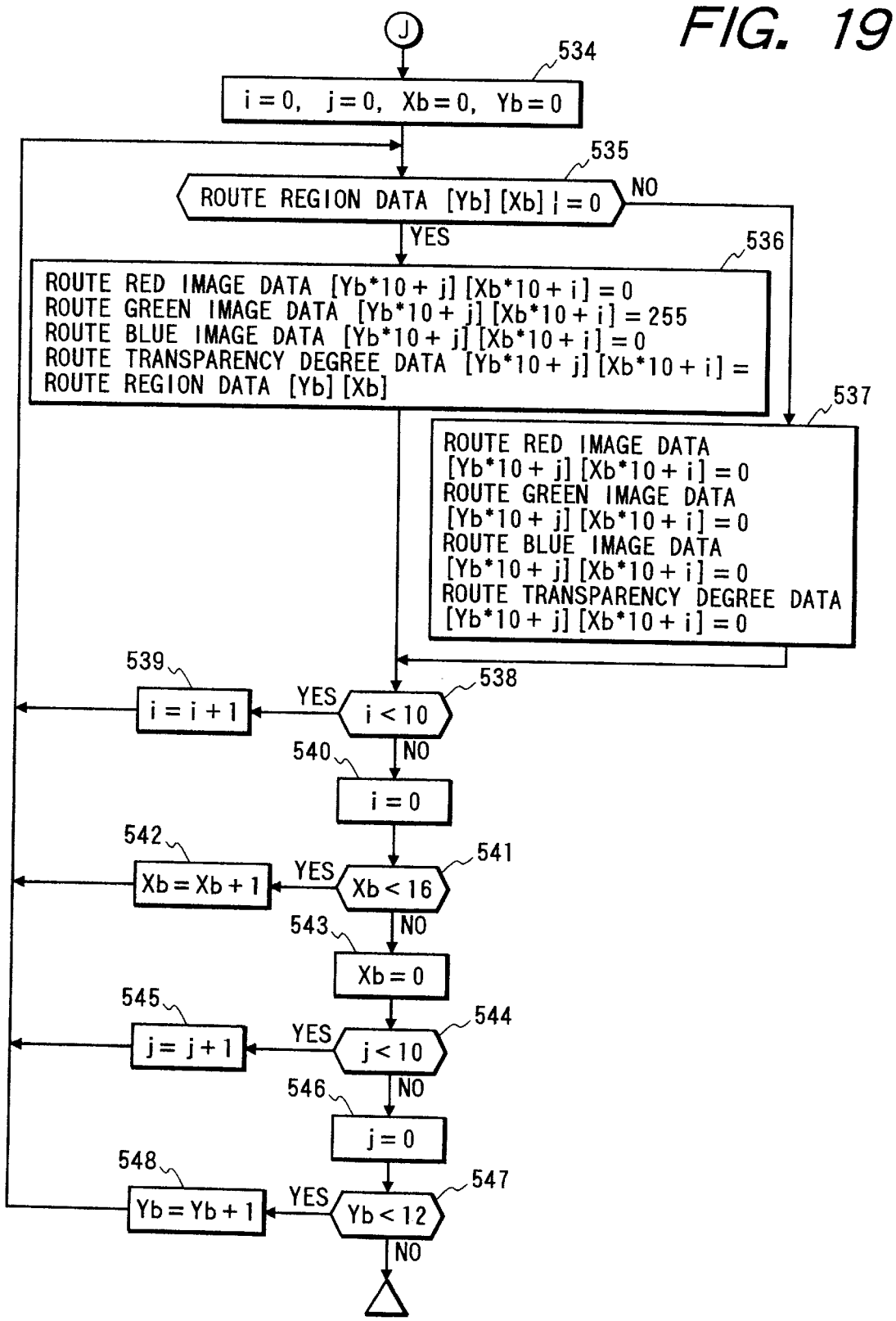
Figure 20:
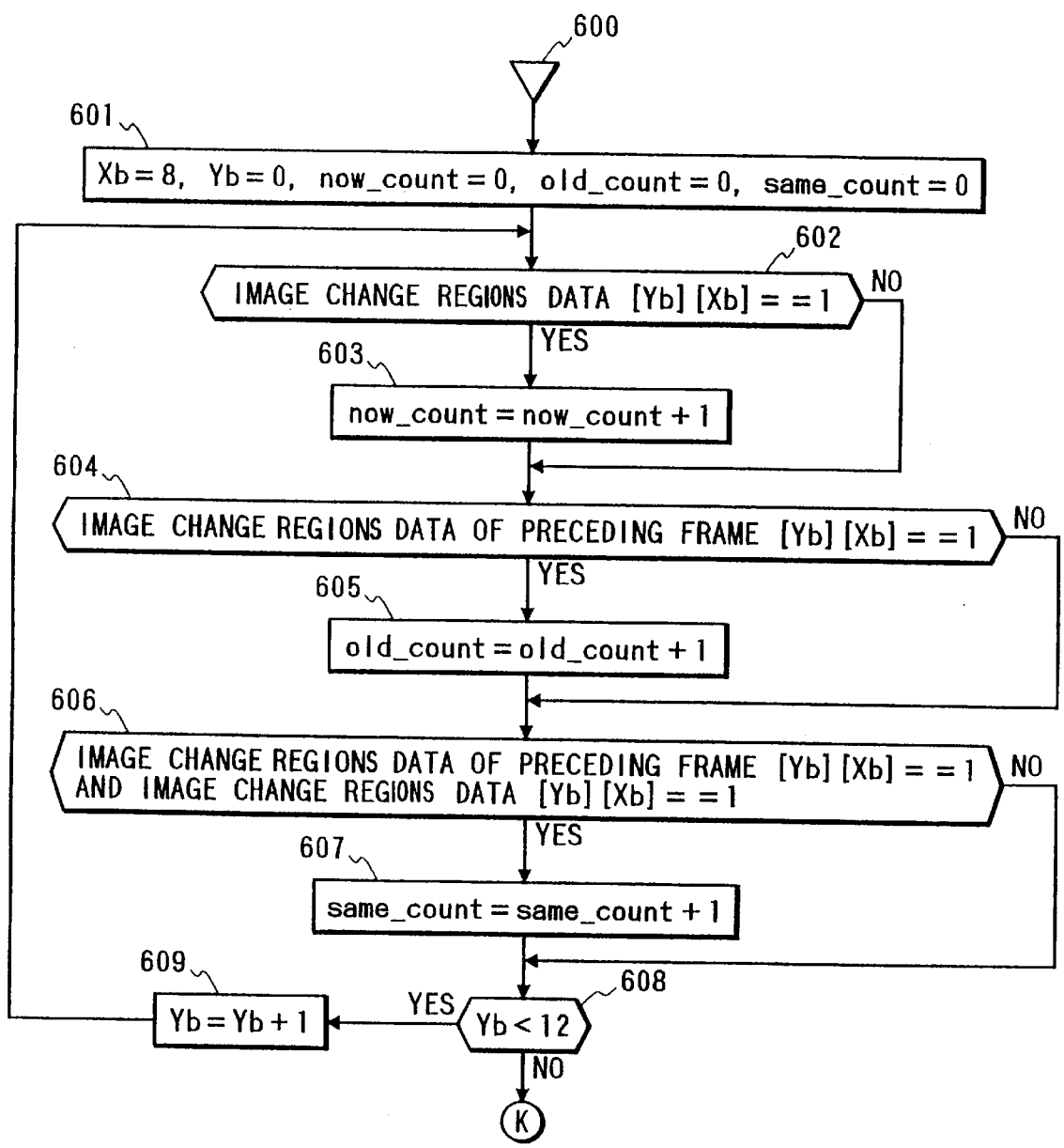
Figure 21:
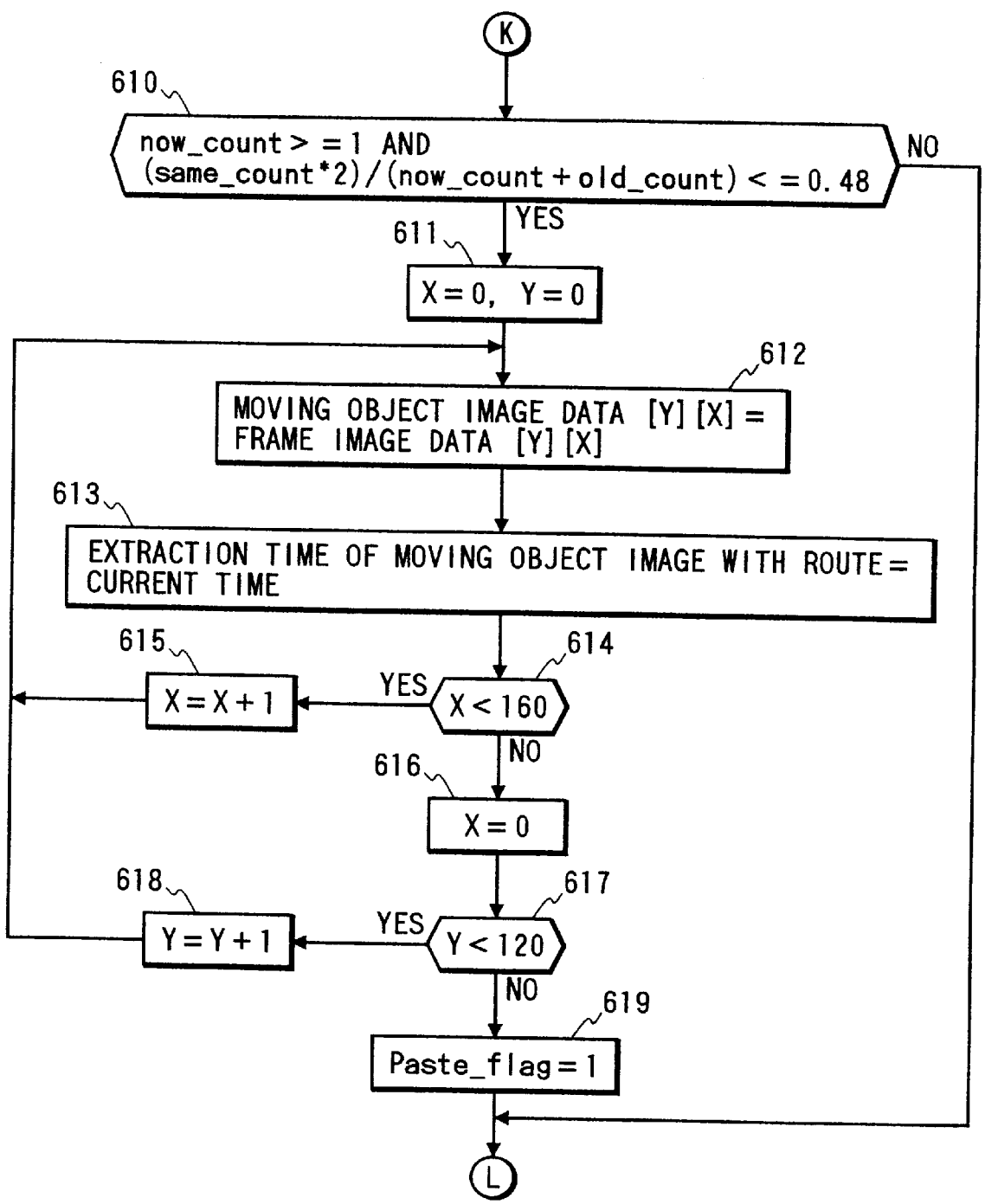
Figure 22:
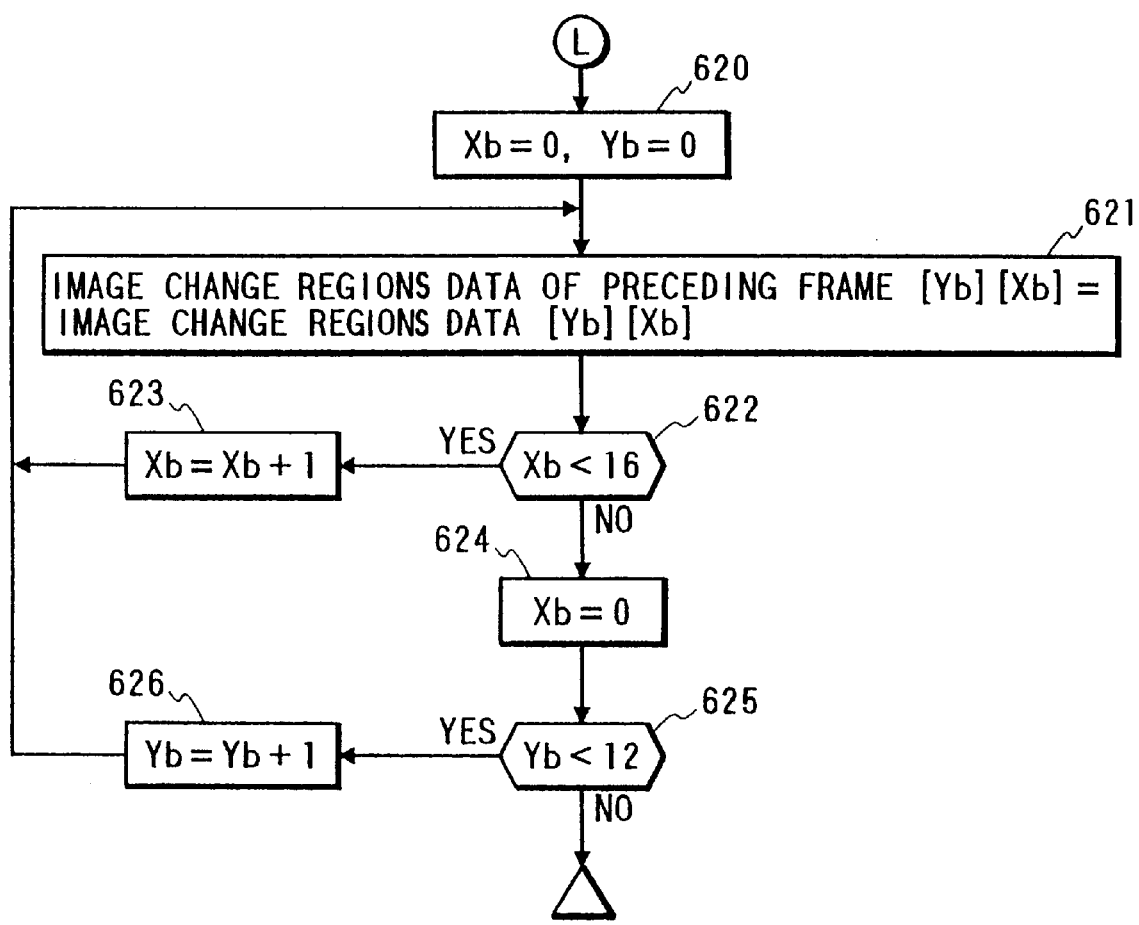
Figure 23:
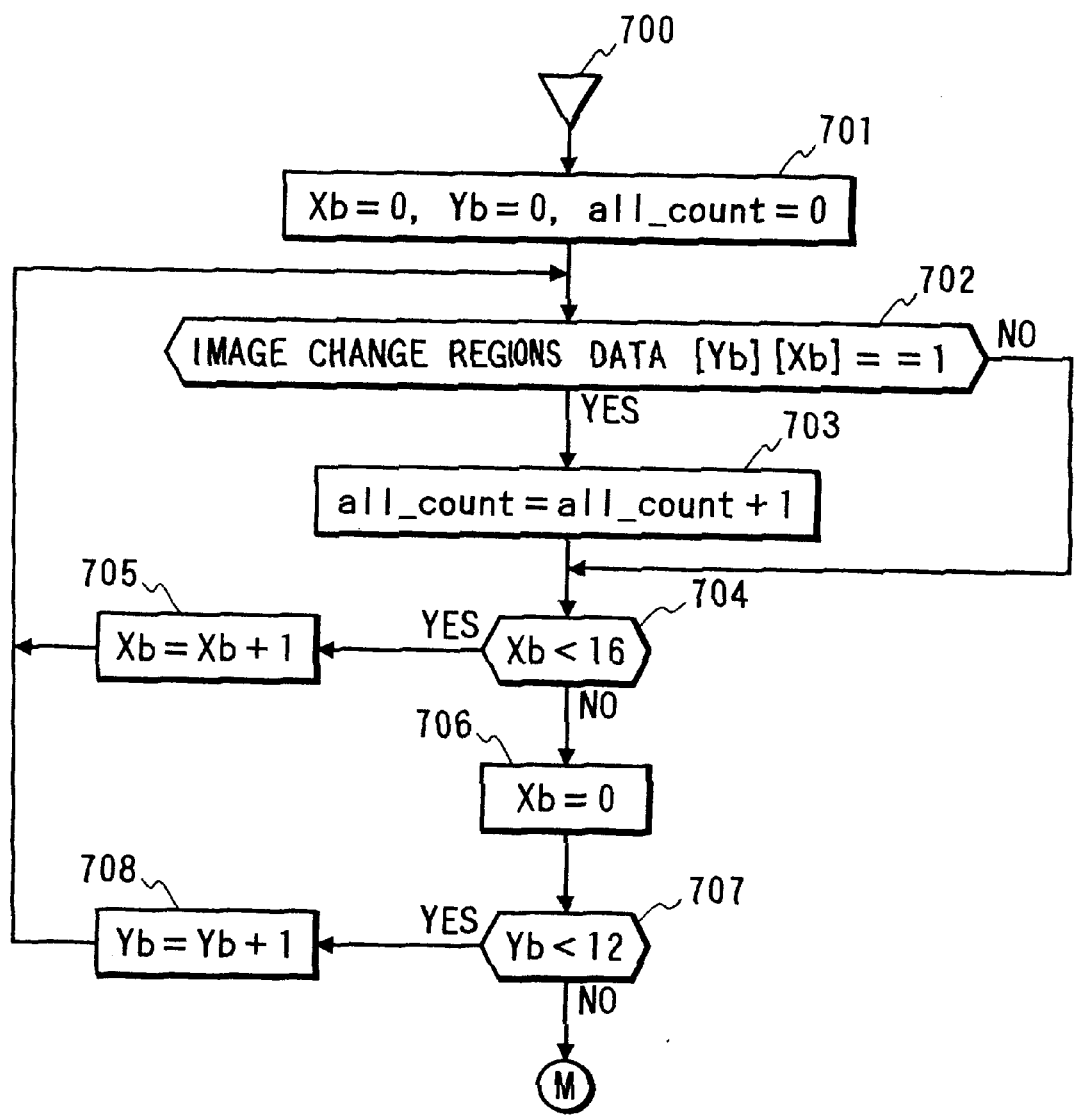
Figure 24:
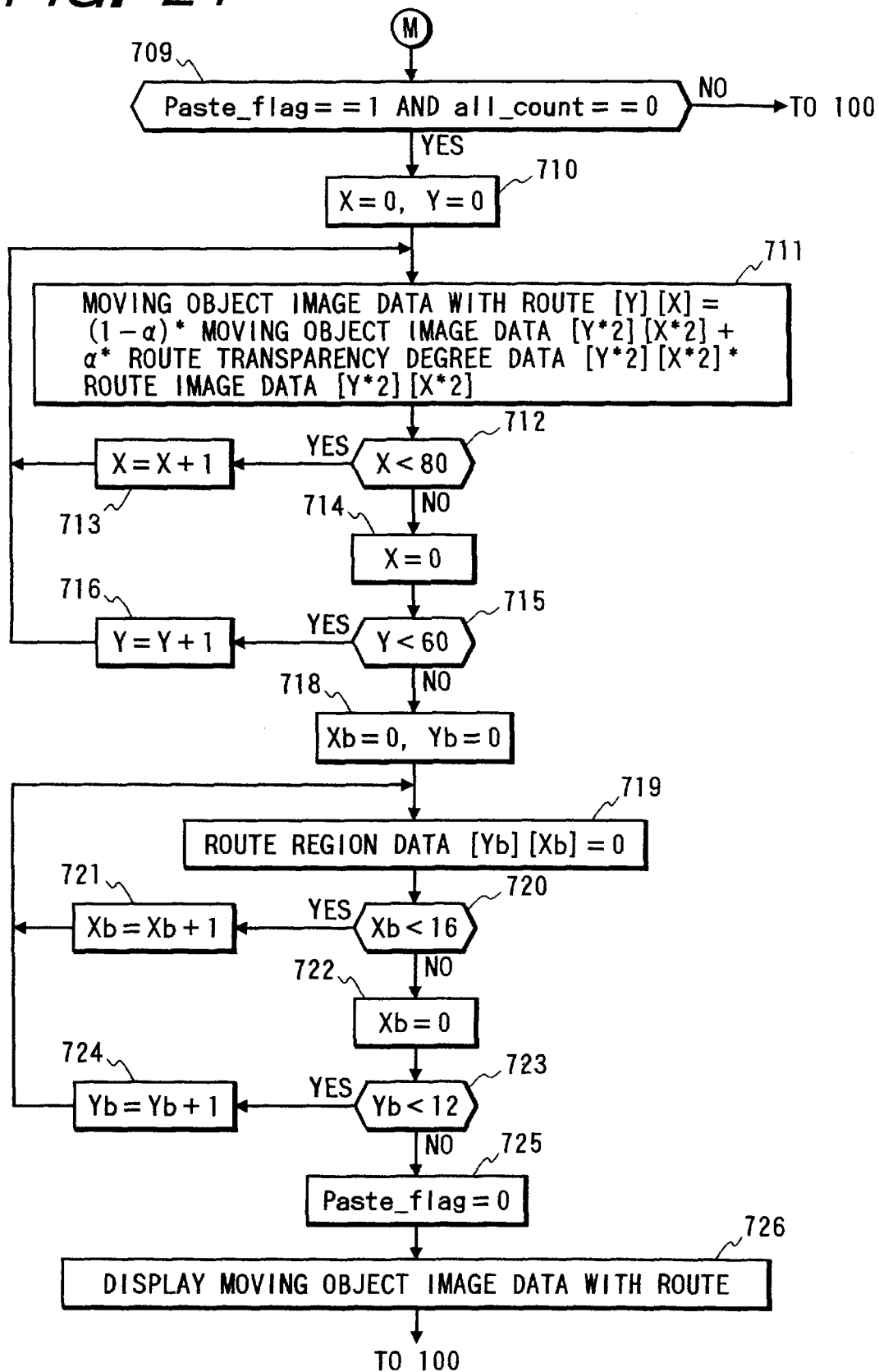
Figure 1:
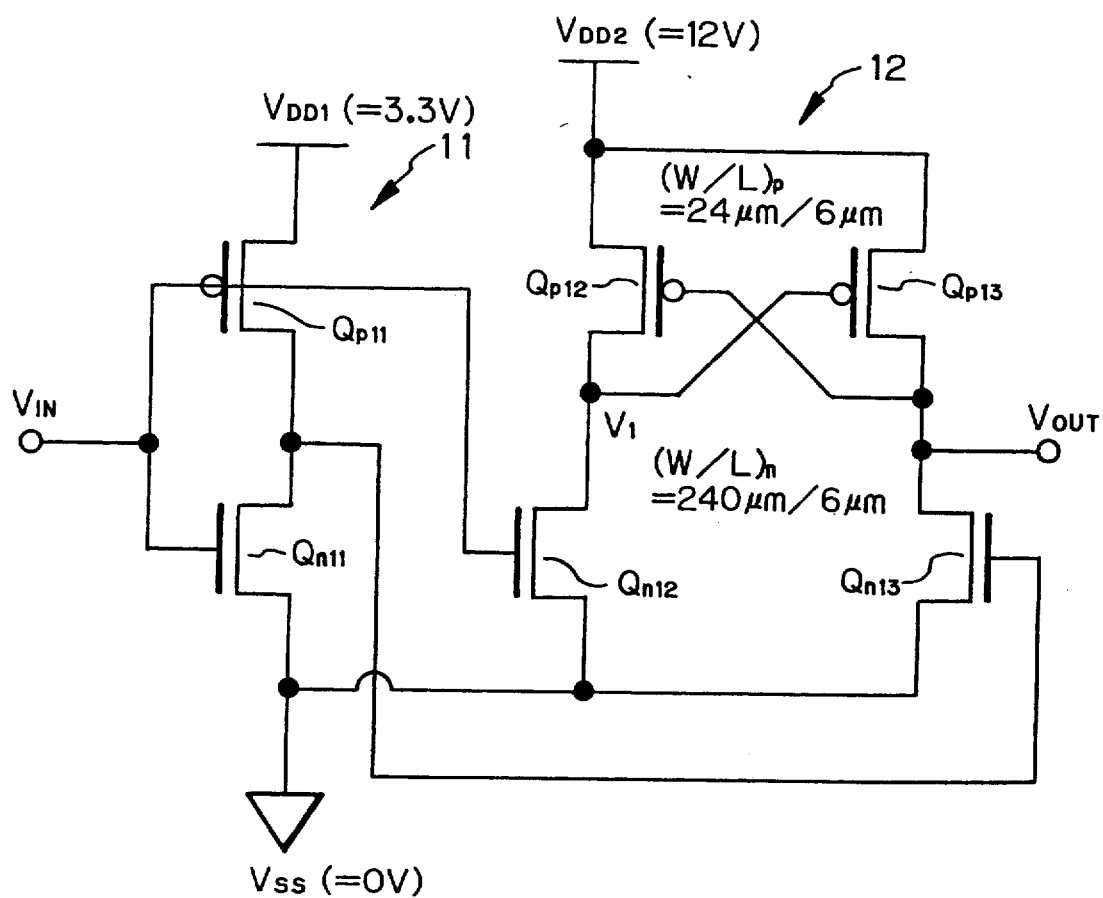
Figure 2:
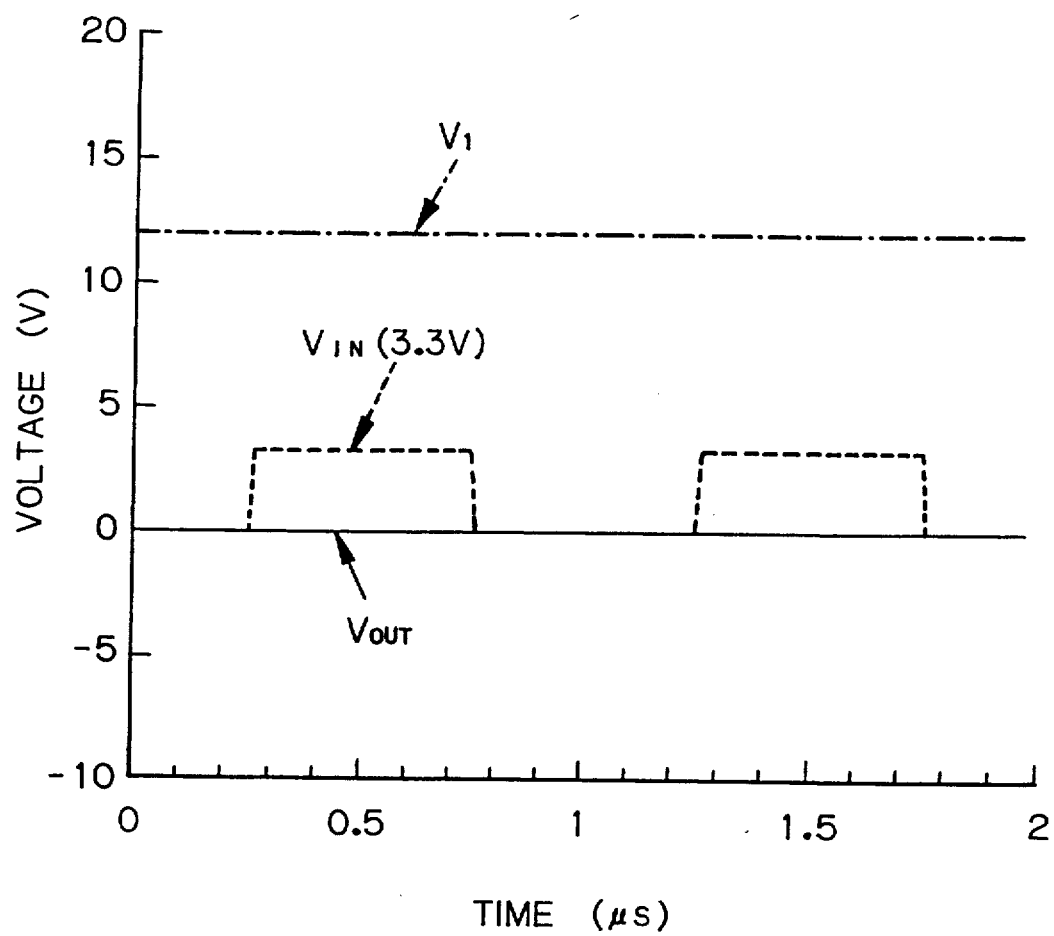
Figure 3:
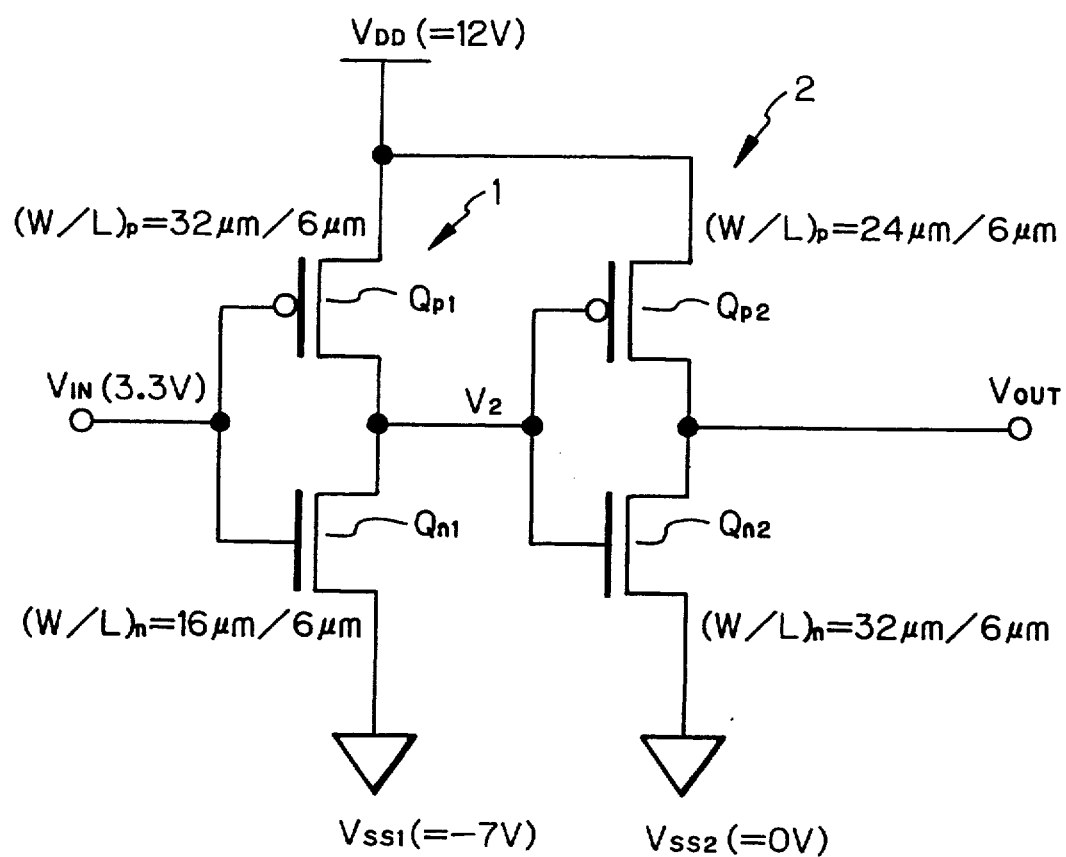

In FIG. 12, which illustrates a circuit to which the level shift circuit of the present invention is applied, reference A designates a level shift circuit of FIGS. 3 or 9, and B designates a clock generating circuit. Note that inverters of the clock generating circuit B are powered by the power supply voltage $V_{DD}$ and the power supply voltage $V_{SS2}$. Thus, even when the absolute values of threshold voltages of the MOS transistors of the circuit of FIG. 12 are 5 V, two-phase clock signals ϕ and ϕ̄ having a voltage swing of 12 V can be obtained. The clock signals ϕ and ϕ̄ are supplied to a scanning circuit of an LCD apparatus or the like. Note that the level shift circuit of the present invention can also be applied to level conversion circuits for an address control signal of a decoder, an enable signal of a scanning circuit or a reset signal of a sample/hold circuit in an LCD apparatus.

As explained hereinabove, according to the present invention, even when the absolute values of threshold voltages of MOS transistors are very large such as 5 V, an input voltage having a small voltage swing can be changed to an output voltage having a large voltage swing. Also, if the absolute values of threshold voltages of MOS transistors are small, the circuit configuration can be reduced, thus enhancing the integration.

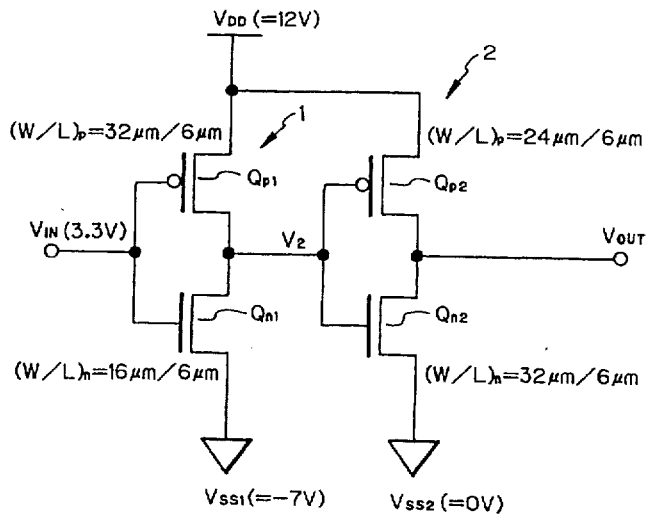

I claim:

1. A level shift circuit comprising:

a first power supply voltage terminal for supplying a first power supply voltage, said first power supply voltage being positive;

a second power supply voltage terminal for supplying a second power supply voltage, said second power supply voltage being negative;

a third power supply voltage terminal for supplying a third power supply voltage;

an input voltage terminal for receiving an input voltage, said input voltage being lower than said first power supply voltage;

an output voltage terminal;

a first CMOS inverter, connected to said input voltage terminal, for receiving said input voltage, said first CMOS inverter being powered by said first and second power supply voltages; and a second CMOS inverter, connected between an output of said first CMOS inverter and said output voltage terminal, for receiving a voltage at the output of said first CMOS inverter and generating an output voltage at said output voltage terminal, wherein said first CMOS inverter comprises
 a first P-channel MOS transistor having a source directly connected to said first power supply voltage terminal, a gate connected to said input voltage terminal and a drain; and
 a first N-channel MOS transistor having a source directly connected to said second power supply voltage terminal, a gate connected to said input voltage terminal and a drain connected to the drain of said first P-channel MOS transistor.

2. The level shift circuit as set forth in claim 1, wherein a sum of an absolute value of a threshold voltage of said first P-channel MOS transistor and a threshold voltage of said first N-channel MOS transistor is larger than a voltage swing of said input voltage.

3. The level shift circuit as set forth in claim 1, wherein a transistor gain factor of said first N-channel MOS transistor is larger than a transistor gain factor of said first P-channel MOS transistor.

4. The level shift circuit as set forth in claim 1, wherein said first P-channel MOS transistor and said first N-channel MOS transistor are formed by polycrystalline silicon thin film transistors.

5. The level shift circuit as set forth in claim 1, wherein said second CMOS inverter comprises:

a second P-channel MOS transistor having a source connected to said first power supply voltage terminal, a gate connected to the drains of said first P-channel MOS transistor and said first N-channel MOS transistor and a drain connected to said output voltage terminal; and a second N-channel MOS transistor having a source connected to said third power supply voltage terminal, a gate connected to the drains of said first P-channel MOS transistor and said first N-channel MOS transistor and a drain connected to said output voltage terminal.

6. The level shift circuit as set forth in claim 1, wherein said second P-channel MOS transistor and said second N-channel MOS transistor are formed by polycrystalline silicon thin film transistors.

7. The level shift circuit as set forth in claim 1, wherein said third power supply voltage is a ground level.

8. A level shift circuit comprising cascaded first and second CMOS inverters, said first CMOS inverter being powered by a first power supply voltage and a second power supply voltage lower than said first power supply voltage, said second CMOS inverter being powered by said first power supply voltage and a third power supply voltage lower than said first power supply voltage, an input voltage supplied to said first CMOS inverter having a high level lower than said first power supply voltage and a low level higher than said second power supply voltage, wherein, said first CMOS inverter comprises a first P-channel MOS transistor having, a source for directly receiving said first power suppply voltage, a gate for receiving said input voltage and a drain; and a first N-channel MOS transistor having a source for directly receiving said second power supply voltage, a gate for receiving said input voltage and a drain connected to the drain of said first P-channel MOS transistor.

9. The level shift circuit as set forth in claim 4, wherein a sum of an absolute value of a threshold voltage of said first P-channel MOS transistor and a threshold voltage of said first N-channel MOS transistor is larger than a difference between said high level and said low level of said input voltage.

10. The level shift circuit as set forth in claim 9, wherein a transistor gain factor of said first N-channel MOS transistor is larger than a transistor gain factor of said first P-channel MOS transistor.

11. The level shift circuit as set forth in claim 9, wherein said first P-channel MOS transistor and said first N-channel MOS transistor are formed by polycrystalline silicon thin film transistors.

12. The level shift circuit as set forth in claim 9, wherein said second CMOS inverter comprises:

a second P-channel MOS transistor having a source for receiving said first power supply voltage, a gate connected to the drains of said first P-channel MOS transistor and said first N-channel MOS transistor and a drain for generating an output voltage; and a second N-channel MOS transistor having a source for receiving said third power supply voltage, a gate connected to the drains of said first P-channel MOS transistor and said first N-channel MOS transistor and a drain for generating said output voltage.

13. The level shift circuit as set forth in claim 9, wherein said second P-channel MOS transistor and said second N-channel MOS transistor are formed by polycrystalline silicon thin film transistors.

14. The level shift circuit as set forth in claim 8, wherein said third power supply voltage is a ground level.

* * * * *

UNITED STATES PATENT AND TRADEMARK OFFICE
CERTIFICATE OF CORRECTION

PATENT : 5,942,915

DATED : Aug. 24, 1999

INVENTOR(S): Hideki Asada

It is certified that error appears in the above-identified patent and that said Letters Patent is hereby corrected as shown below:

The title page, showing the illustrative figure, should be deleted and substitute therefor the title page, as shown on the attach page.

In the Drawings:
Drawing Sheets 1-24, consisting of FIGS. 1-24, should be deleted and substitute therefor Drawing Sheets 1-12, consisting of FIGS. 1-12, as shown on the attach pages.

Signed and Sealed this

Twenty-fifth Day of July, 2000

Q. TODD DICKINSON

*Attest:*

*Attesting Officer*   Director of Patents and Trademarks

United States Patent [19]
Asada

[11] Patent Number: 5,942,915
[45] Date of Patent: Aug. 24, 1999

[54] LEVEL SHIFT CIRCUIT FORMED BY TWO CASCADED CMOS INVERTERS

[75] Inventor: Hideki Asada, Tokyo, Japan

[73] Assignee: NEC Corporation, Tokyo, Japan

[21] Appl. No.: 08/925,726

[22] Filed: Sep. 9, 1997

[30] Foreign Application Priority Data

Sep. 9, 1996 [JP] Japan ................... 8-237587

[51] Int. Cl.⁶ ........................... H03K 19/0175
[52] U.S. Cl. ................ 326/81; 326/68; 326/83
[58] Field of Search ................. 326/81, 80, 68, 326/83, 86, 112, 119, 121, 102, 103

[56] References Cited

U.S. PATENT DOCUMENTS

| | | | |
|---|---|---|---|
| 4,028,556 | 6/1977 | Cachier et al. | 326/102 |
| 4,092,548 | 5/1978 | Beilstein, Jr. et al. | 326/102 |
| 4,191,898 | 3/1980 | Ulmer | 326/68 |
| 5,089,862 | 2/1992 | Warner, Jr. et al. | 257/208 |
| 5,323,071 | 6/1994 | Hirayama | 326/68 |
| 5,332,934 | 7/1994 | Hashimoto et al. | 326/121 |
| 5,463,330 | 10/1995 | Tsuchida | 326/81 |
| 5,666,070 | 9/1997 | Merritt et al. | 326/81 |
| 5,705,940 | 1/1998 | Newman et al. | 326/68 |
| 5,821,559 | 10/1998 | Yamazaki et al. | 257/66 |

FOREIGN PATENT DOCUMENTS

| | | |
|---|---|---|
| 50-151433 | 12/1975 | Japan . |
| 57-075027 | 5/1982 | Japan . |
| 62-195921 | 8/1987 | Japan . |
| 2-122724 | 5/1990 | Japan . |

*Primary Examiner*—Michael Tokar
*Assistant Examiner*—Daniel D. Chang
*Attorney, Agent, or Firm*—Sughrue, Mion, Zinn, Macpeak & Seas, PLLC

[57] ABSTRACT

In a level shift circuit including cascaded first and second CMOS inverters, the first CMOS inverter is powered by a first power supply voltage and a second power supply voltage lower than the first power supply voltage. Also, the second CMOS inverter is powered by the first power supply voltage and a third power supply voltage lower than the first power supply voltage. An input voltage supplied to the first CMOS inverter has a high level lower than the first power supply voltage and a low level higher than the second power supply voltage.

14 Claims, 24 Drawing Sheets